US006048630A

United States Patent [19]
Burrows et al.

[11] Patent Number: 6,048,630
[45] Date of Patent: Apr. 11, 2000

[54] RED-EMITTING ORGANIC LIGHT EMITTING DEVICES (OLED'S)

[75] Inventors: Paul Burrows, Princeton Junction; Stephen R. Forrest, Princeton, both of N.J.; Mark E. Thompson, Anaheim, Calif.

[73] Assignees: The Trustees of Princeton University, Princeton, N.J.; The University of Southern California, Los Angeles, Calif.

[21] Appl. No.: 08/774,087

[22] Filed: Dec. 23, 1996

Related U.S. Application Data

[60] Provisional application No. 60/021,095, Jul. 2, 1996.

[51] Int. Cl.⁷ .................................................. H05B 33/13
[52] U.S. Cl. .......................... 428/690; 428/917; 313/504
[58] Field of Search .................................. 428/690, 917; 313/504–509

[56] References Cited

U.S. PATENT DOCUMENTS

| 5,294,870 | 3/1994 | Tang et al. . | |
|---|---|---|---|
| 5,409,783 | 4/1995 | Tang et al. . | |
| 5,554,220 | 9/1996 | Forrest et al. . | |
| 5,703,436 | 12/1997 | Forrest et al. | 313/506 |
| 5,707,745 | 1/1998 | Forrest et al. | 428/432 |

FOREIGN PATENT DOCUMENTS

WO 96/19792   6/1996   WIPO .

OTHER PUBLICATIONS

S.R. Forrest, Burrows, Thompson, "Organic Emitters Promise a New Generation of Displays", Laser Focus World, Feb. 1995.

J. Kido, M. Kimura, K. Nagai, "Multilayer White Light--Emitting Organic Electroluminescent Device" Science vol. 267, 1332 (Mar. 1995).

A. Dodabalapur et al., "Microcavity Effects in Organic Semiconductors" Appl. Phys. Lett., vol. 64, 2486 (May 1994).

M. Granstrom et al., "White Light Emission froma Polymer Blend Light Emitting Diode" Appl. Phys. Lett. vol. 68, 147 (Jan. 1996).

(List continued on next page.)

Primary Examiner—Charles Nold
Attorney, Agent, or Firm—Kenyon & Kenyon

[57] ABSTRACT

Disclosed herein are novel dopant compounds of Formula I below, wherein those compounds are used in organic light emitting devices (OLED's) for device elements capable of emitting light of wavelengths associated with saturated red emissions.

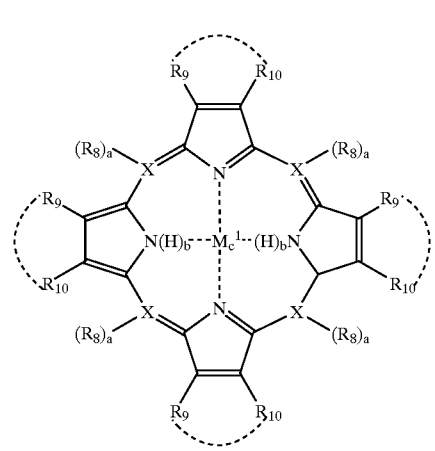

Also disclosed are OLED's utilizing device elements comprising the above compounds and display devices based on those OLED's.

13 Claims, 20 Drawing Sheets

OTHER PUBLICATIONS

B.O. Dabbousi et al., "Electroluminescence from CdSe Quantum–dot/polymer Composites" Appl. Phys. Lett., vol. 66, 1316 (Mar. 1995).

V.L. Colvin et al.,, "Light–emitting Diodes Made From Cadmium Selenide Nanocrystals and a Semiconducting Polymer", Nature 370, 354 (1994).

P.E. Burrows et al., "Electroluminescence from Trap–Limited Current Transport in Vacuum Deposited Organic Light Emitting Devices" Applied Phys. Lett. vol. 64, 2285 (Apr. 1994).

C. Adachi et al., "Blue Light–Emitting Organic Electroluminescent Devices" Applied Phys. Lett., vol. 56 799–801 (Feb. 1990).

M.J. Heeg et al., "Decaphenylgermanocene, –stannocene and –plumbocene[N5–(C6H5)5C5]2E(E=Ge,Sn, Pb) and the X–ray crystal and molecular structure of pentaphenylstannocene, n5–(C6H5)5C5SnC5H5–n5" J. Organometallic Chem., vol. 346, 321–332 (1988).

G. Gustafsson et al, "The Plastic LED: A Flexible Light––Emitting Device Using a Polyaniline Transparent Electrode" Synthetic Metals, 55–57, 4123–4227 (1993).

Y. Zhang & S.R. Forrest, "Mechanisms of Quasiepitaxial Ordering at Organic Molecular Thin Film Interfaces" Phys. Rev. Lett. 71, 2765 (May 1993).

C. Kittel, "Introduction to Solid State Physics" Solid State Physics 4th ed. (Wiley, NY 1971) 143.

Tang et al, "Organic Electroluminescent Diodes", American Institute of Physics, Appl Phys Letter 51(12) (Sep. 1987) p. 913–915.

Lin, V.S.–Y.; Therien, "Highly Conjugated, Acetylenyl Bridged Porphyrins: New Models for Light–Harvesting Antenna Systems", M.J., Science 264, 1105–111 (1994).

Depp, et al., "Flat Panel Displays," Scientific American, Mar. 1993, 90–97.

Hamata, Y., et al., "Blue Electroluminescence in Thin Films of Azomethin–Zinc Complexes", Jpn. J. Appl. Phys. 32 (1993) Pt. 2, No. 4A, L511–L513.

Hamata, Y., et al., "High Luminance in Organic Electroluminescent Devices with Bis(10–hydroxybezo[h]quinolinato) Beryllium as an Emitter", Chem. Lett. 1993, 905–906.

Hamata, Y. et al., "Organic Electroluminescent Devices with 8–Hydroxyguinoline Derivative–Metal Complexes as an Emitter", Jpn. J. Appl. Phys. 32 (1993) Pt. 2, No. 4A, L514–L515.

$R^1 =$ 3,5- di(t-bu) pheno 2,6- di (t-bu)phenol

,6- di(t-bu)cresci

H$_2$Bpz$_2$

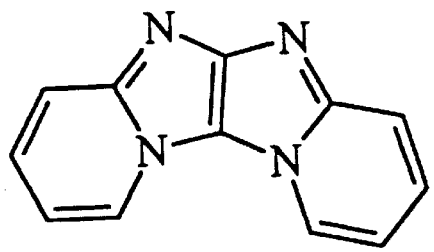
Fig. 10F
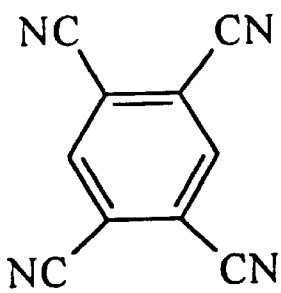
Fig. 10B
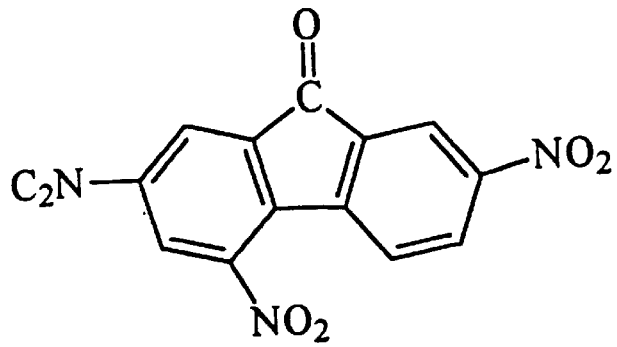
Fig. 10D
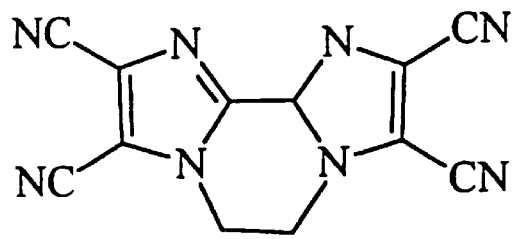
Fig. 10C
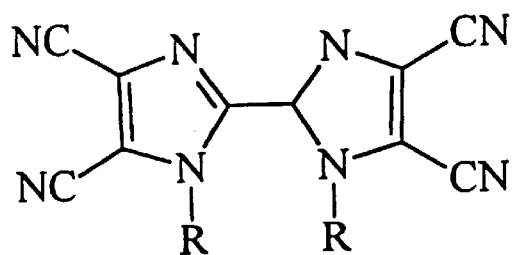
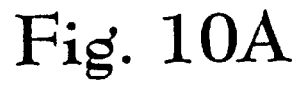
Fig. 10A

RED-EMITTING ORGANIC LIGHT EMITTING DEVICES (OLED'S)

CROSS-REFERENCE TO RELATED APPLICATION

This application claims priority under 35 U.S.C. § 119(e) to provisional application 60/021,095, filed on Jul. 2, 1996, now abandoned, which is hereby incorporated by reference.

FIELD OF THE INVENTION

This invention relates, in general, to multicolor organic light emitting devices (OLED's) and, more particularly, to combinations of dopants and host compounds that enable the generation of a saturated red emission suitable for use in devices such as, for example, flat panel electronic displays.

BACKGROUND OF THE INVENTION

Electronic display devices are becoming an increasingly indispensable tool in modern society for the delivery of visual information. These devices find widespread utility in television sets, computer terminals, and in a host of related applications. No other type of technology offers comparable speed, versatility and potential for interactivity. Current electronic display technologies include, for example, cathode ray tubes (CRT's), plasma displays, light emitting diodes (LED's), thin film electroluminescent displays, and the like.

The most widely-used non-emissive technology for display devices makes use of the electro-optic properties of a class of organic molecules known as liquid crystals in fabricating liquid crystal displays (LCD's). LCD's operate fairly reliably, but are limited by relatively low contrast, low speed, and fade-out when viewed from oblique angles, as well as the requirement for high power backlighting. Active matrix displays, in a partial solution to these shortcomings, employ an array of transistors, each capable of activating a single liquid crystal pixel, thus improving contrast.

There is no doubt that flat panel display technology is of significant scientific and commercial interest. Consequently, it is the subject of extensive ongoing research. See Depp, S. W. and Howard, W. E., "Flat Panel Displays," *Scientific American,* March 1993, pps. 90–97. According to Depp and Howard, by 1995, flat panel displays alone were expected to generate a market of between $4 and $5 billion. Key to the success of any potential display technology in this market is the ability to both provide a high resolution, full-color display at good light level and, at the same time, to be competitively priced.

Organic thin film materials represent a technical development that has demonstrated considerable progress in the fabrication of red, green and blue light emitting devices. These organic light emitting devices have been shown to have sufficient brightness, range of color and operating lifetimes for use as a practical alternative technology to LCD-based full color flat-panel displays (S. R. Forrest, et al., *Laser Focus World,* February 1995). Furthermore, since many of the organic thin films used in such devices are transparent in the visible spectral region, they potentially allow for the realization of a completely new type of display pixel in which the red (R), green (G), and blue (B) emission layers are placed in a vertically stacked geometry to provide a simple fabrication process, minimum R-G-B pixel size, and maximum fill factor.

Disclosed in U.S. Pat. No. 5,294,869 to C. W. Tang and J. E. Littman is a concept for using separate, side-by-side red, green, and blue OLED's to make a full color display. However, it is believed by the inventors of the instant disclosure that such concepts have never been successfully realized in a practical device.

Such schemes suffer from a complex layer structure, and lack of known methods for damage-free, post-deposition patterning of organic layers at the resolution required for color displays. Others have alternatively suggested using an array of white OLED's (J. Kido, et al., *Science* 267, 1332 (1995)) backed by side-by-side R, G and B color filters deposited and patterned prior to OLED growth. However, such a design sacrifices at least 66% of the light from each white OLED, with the remainder being absorbed in the filter, also generating heat. Such a design suffers, therefore, from low efficiency and conditions of accelerated degradation. Alternative schemes based on microcavity filtering of a broad-spectrum OLED (A. Dodabalapur, et al., *Appl. Phys. Lett.* 64, 2486 (1994)) suffer from complex and expensive substrate patterning requirements and extremely limiting directionality of the resulting color pixels.

An example of a multicolor electroluminescent image display device employing organic compounds for light emitting pixels is disclosed in Tang et al., U.S. Pat. No. 5,294, 870. This patent discloses a plurality of light emitting pixels which contain an organic medium for emitting blue light in subpixel regions. Fluorescent media are laterally spaced from the blue-emitting subpixel region. The fluorescent media absorb light emitted by the organic medium and, in turn, emit red and green light in different subpixel regions. The use of materials doped with fluorescent dyes to emit green or red on absorption of blue light from the blue subpixel region is less efficient than direct formation via green or red LED's. The reason is that the efficiency will be the product of (quantum efficiency for EL) and (quantum efficiency for fluorescence) and (1-transmittance). Thus, a drawback of this display and all displays of this type is that different laterally spaced subpixel regions are required for each color emitted.

Color-tunable OLED's potentially allow for full-color operation without the complex structures common to other types of devices. Published examples of tunable OLED's utilize a blend of either two polymers (M. Granstrom and O. Inganas, *Appl. Phys. Lett.* 68, 147 (1996)) or a polymer doped with semiconductor nanocrystallites (B. O. Dabbousi, et al., *Appl. Phys. Lett.* 66, 1316 (1995); V. L. Colvin, et al., *Nature* 370, 354 (1994)). Each component of the blend emits radiation having a different spectral energy distribution. The color is tuned by varying the applied voltage. A higher voltage results in more emission from the higher bandgap polymer, which emits radiation toward the blue region of the spectrum, while also resulting in higher overall brightness due to increased current injection into the device. Although tuning from orange to white has been demonstrated, incomplete quenching of the low-energy spectral emission appears to prohibit tuning completely into the blue. In addition, emission intensity can only be controlled by using pulsed current and reduced duty cycles. In a color display, therefore, prohibitively high drive voltages and very low duty cycles may be necessary for blue pixels. This necessitates a complex driver circuit, renders passive matrix operation extremely difficult, if not impossible, and is likely to accelerate degradation of the display.

A transparent organic light emitting device (TOLED) which represents a first step toward realizing high resolution, independently addressable stacked R-G-B pixels has been reported recently in the published international patent application No. WO 92/19792, which corresponds to U.S. Pat. No. 5,707,745. This TOLED had greater than 71% transparency when turned off, and emitted light from both top and bottom device surfaces with high efficiency (approaching 1% quantum efficiency) when the device was turned on. The TOLED used transparent indium tin oxide (ITO) as the hole-injecting electrode layer, and a Mg:Ag-ITO layer for electron injection. A device was disclosed in which the Mg:Ag-ITO electrode was used as a hole-injecting contact for a second, different color-emitting OLED stacked on top of the TOLED. Each device in the stack was independently addressable and emitted its own characteristic color through the transparent organic layers, the transparent contacts and the glass substrate allowing the entire device area to emit any combination of color that could be produced by varying the relative output of the two color-emitting layers.

Thus, for the specific device disclosed in WO 92/19792, which included a red-emitting layer and a blue-emitting layer, the color output produced by the pixel could be varied in color from deep red through blue.

It is herein believed that WO 92/19792 provided the first demonstration of an integrated OLED where both intensity and color could be independently varied by using external current sources. As such, WO 92/19792 represents the first proof-of-principle for achieving integrated, full color pixels which provide the highest possible image resolution (due to the compact pixel size) and low cost fabrication (due to the elimination of the need for side-by-side growth of the different color-producing pixels).

Presently, a frequently used high-efficiency organic emissive structure is one referred to as the double heterostructure LED which is known to those of skill in the appropriate art. This structure is very similar to conventional, inorganic LED's using materials as GaAs or InP. In this type of device, a support layer of glass is coated by a thin layer of indium/tin oxide (ITO) to form the substrate for the structure. Next, a thin (100–500 Å) organic, predominantly hole-transporting, layer (HTL) is deposited on the ITO layer. Deposited on the surface of the HTL layer is a thin (typically, 50–100 Å) emissive layer (EL). If these layers are too thin, there may be breaks in the continuity of the film; as the thickness of the film increases, the internal resistance increases, requiring higher power consumption for operation. The range of 100–1000 Å represents the best typical compromise between these extremes. The emissive layer (EL) provides the recombination site for electrons, injected from a 100–500 Å thick electron transporting layer (ETL) that is deposited upon the EL, and holes from the HTL layer. The ETL material is characterized by considerably higher mobility for electrons than for charge deficient centers (holes). Examples of prior art ETL, EL and HTL materials are disclosed in U.S. Pat. No. 5,294,870 entitled "Organic Electroluminescent Multi-Color Image Display Device," issued on Mar. 15, 1994 to Tang et al., the disclosure of which is hereby incorporated by reference.

Often, the EL layer is doped with a highly fluorescent dye to tune the frequency of the light emitted (color), and increase the electroluminescence efficiency of the LED. The double heterostructure device described above is completed by depositing metal contacts onto the ITO Layer, and a top electrode onto the electron transporting layer. The contacts are typically fabricated from indium or Ti:Pt:Au. The electrode is often a dual-layer structure consisting of an alloy such as Mg:Ag directly contacting the organic ETL layer, and a thick, opaque second layer of a high work function metal such as gold (Au) or silver (Ag) on the Mg:Ag or the transparent Mg:Ag/ITO electrode. When proper bias voltage is applied between the top electrode and the metal contacts, light emission occurs through the glass substrate for devices with an opaque top electrode, and through both surfaces for transparent OLED's. An LED device of this type typically has luminescent external quantum efficiencies of from 0.05 percent to 4 percent depending on the color of emission and the device structure.

Another known organic emissive structure is referred to as a single heterostructure. The difference in this structure relative to that of the double heterostructure is that the electroluminescent layer also serves as an ETL layer, eliminating the need for the ETL layer. However, this type of device, for efficient operation, must incorporate an EL layer having good electron transport capability, otherwise a separate ETL layer must be included, rendering the structure effectively the same as a double heterostructure.

Presently, the highest efficiencies have been observed in green LED's. Furthermore, drive voltages of 3 to 10 volts have been achieved. These early and very promising demonstrations have used amorphous or highly polycrystalline organic layers. These structures undoubtedly limit the charge carrier mobility across the film which, in turn, limits current and increases drive voltage. Migration and growth of crystallites arising from the polycrystalline state is a noted failure mode of such devices. Electrode contact degradation is also a common mechanism of failure.

A known alternative device structure for an LED is referred to as a single layer (or polymer) LED. This type of device includes a glass support layer coated by a thin ITO layer, forming the base substrate. A thin organic layer of spin-coated polymer, for example, is then formed over the ITO layer, and provides all of the functions of the HTL, ETL, and EL layers of the previously described devices. A metal electrode layer is then formed over the organic polymer layer. The metal is typically Mg, Ca, or other conventionally used metals.

Devices whose structure is based upon the use of layers of organic optoelectronic materials generally rely on a common mechanism leading to optical emission. Typically, this mechanism is based upon the radiative recombination of a trapped charge. Specifically, devices constructed along the lines discussed above comprise at least two extremely thin organic layers separating the anode and cathode of the device. The material of one of these layers is specifically chosen based on the material's ability to transport holes (the HTL layer); the other, according to its ability to transport electrons (the ETL or EL layer). This last layer typically comprises the electroluminescent layer. With such a construction, the device can be viewed as a diode with a forward bias when the potential applied to the anode is higher than the potential applied to the cathode. Under these bias conditions, the anode injects holes (positive charge carriers) into the electroluminescent layer, while the cathode injects electrons into the EL layer. The portion of the luminescent medium adjacent to the anode thus forms a hole injecting and transporting zone while the portion of the luminescent medium adjacent to the cathode forms an electron injecting and transporting zone. The injected holes and electrons each migrate toward the oppositely charged electrode. When an electron and hole localize on the same molecule, a Frenkel exciton is formed. Recombination of this short-lived state may be visualized as an electron dropping from its conduction potential to a valence band, with relaxation occurring preferentially, under certain conditions, via a photoemissive mechanism. Under this view of the mechanism of operation of typical thin-layer organic devices, the electroluminescent layer comprises a luminescence zone receiving mobile charge carriers (electrons and holes) from each electrode.

A specific example of a red-emitting device is disclosed in U.S. Pat. No. 5,409,783 to Chang et al. The disclosed device utilizes an EL layer of tris(8-quinolinol) aluminum doped with magnesium phthalocyanine to achieve a red emission suitable for use in printing on color photographic paper. However, according to FIG. 5 of the reference, the emission spectrum of such a device, while displaying an emission maximum at approximately 690 nm, also displays a significant emission maximum at 530 nm (green). Although this apparently does not pose a problem for applications such as color printing, mentioned in Example 1 of the reference, such an emission would be unacceptable for use in a pixel device for a visual display in that the red light emission would be highly unsaturated.

SUMMARY OF THE INVENTION

The present invention is generally directed to a multicolor organic light emitting device, and structures containing the same, employing an emissive layer comprising emitting compounds selected for the emission of desirable primary colors. Included among these compounds are those disclosed in Applicants' co-pending U.S. patent application Ser. No. 08/774,120, filed Dec. 23, 1996 and Ser. No. 08/693,359, filed Aug. 6, 1996, the disclosures of which are hereby incorporated by reference. In particular, the present invention is directed to the use of a select group of dopants which, when added in effective amounts to suitable receiving compounds, including emitting compounds and/or host compounds, enhance the emission of red light.

The dopants for use in the present invention include compounds of Formula I (see also FIG. 1):

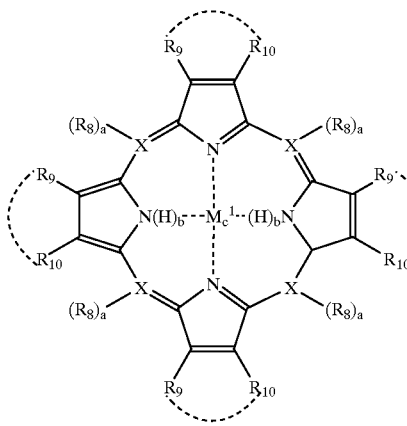

wherein

X is C or N;

$R_8$, $R_9$, and $R_{10}$ are each independently selected from the group consisting of hydrogen; alkyl; substituted alkyl; aryl; substituted aryl, with substituents selected from the group consisting of lower alkyls, halogens and recognized donor and acceptor groups;

$R_9$ and $R_{10}$ may be combined together to form a fused ring;

$M_1$ is a divalent, trivalent or tetravalent metal;

a, b and c are each 0 or 1;

wherein, when X is C, then a is 1; when X is N, then a is 0;

when c is 1, then b is 0; and when b is 1, c is 0.

Also contemplated are acetylenyl bis-molecular arrays of the compounds of Formula I, represented, in general, by the formula I—C≡C—I, as disclosed in Lin, V. S. -Y.; Therien, M. J., Science 264, 1105–1111 (1994).

The dopants for use in the present invention are incorporated into a host compound so that the LED device emits light that is perceived by the human eye to be close to a saturated red color. Through the practice of the present invention, it is possible to construct OLED's characterized by an emission that is closer to an absolute (or saturated) value, as that would be defined by the CIE scale, for example, than heretofore possible. Furthermore, LED's utilizing the materials of the present invention are also capable of a display brightness that can be in excess of 100 cd/m².

The receiving compounds as defined herein are any compounds which can be doped with the dopants defined above to emit light with the desired spectral characteristics. Such compounds include, but are not limited to, both emitting compounds and host compounds as described in U.S. patent application Ser. No. 08/693,359, filed Aug. 6, 1996, incorporated herein by reference.

For example, emitting compounds can include compounds of Formula II:

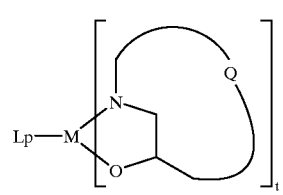

wherein

M is a trivalent metal ion;

Q is at least one fused ring, at least one of said fused rings containing at least one nitrogen atom;

and L is a ligand selected from the group consisting of: picolylmethylketone; substituted and unsubstituted salicylaldehyde;

a group of the formula $R^1(O)CO$,
wherein R' is selected from the group consisting of hydrogen, an alkyl group, an aryl group, and a heterocyclic group, each of which may be substituted with at least one substituent selected from the group consisting of aryl, halogen, cyano and alkoxy;

halogen;

a group of the formula $R^1O$, wherein $R^1$ is as defined above;

bistriphenyl siloxides; and quinolates and derivatives thereof;

p is 1 or 2; and t is 1 or 2, where p does not equal t.

Emitting compounds can also be of Formulas III and IV:

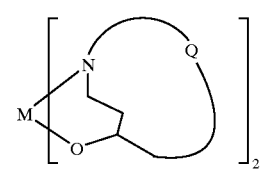

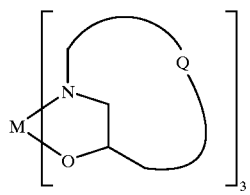

IV wherein Q is defined as above for both III and IV, and where M is divalent for III and trivalent for IV. Exemplary compounds coming within Formulas II and IV are illustrated in FIGS. 2A–2I, and 3A–3M, respectively. Other compounds suitable as emitting compounds for receiving the dopants are shown in FIGS. 4A–10J. Specific examples of compounds of Formula III, as well as information on the preparation of such compounds, as readily comprehended by one of skill in the art, can be found in the following publications: Hamata, Y., et al., *Jpn. J. Appl. Phys.* 32 (1993) Pt. 2, No. 4A, L511–L513; Hamata, Y., et al., *Chem. Lett.* 1993, 905–906; Hamata, Y., et al., *Jpn. J. Appl. Phys.* 32 (1993) Pt. 2, No. 4A, L514–L515.

Host compounds which facilitate the carrying of charge or excitation to the emitting compounds to initiate light emission and which can also receive dopants in accordance with the present invention include compounds of Formulas V–VIII as shown below, and in FIGS. 12A–12D:

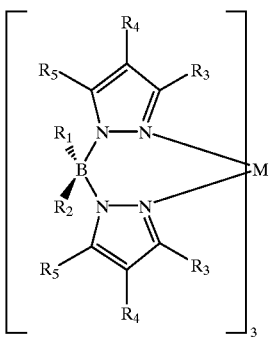

V

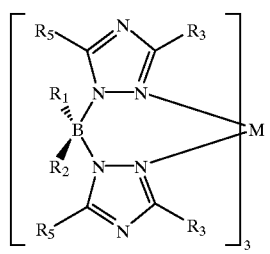

VI

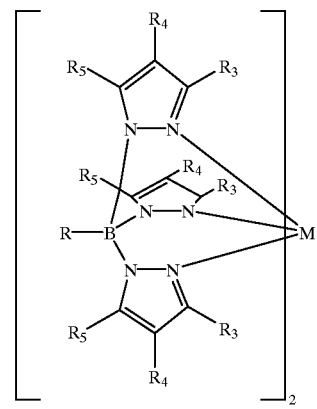

VII

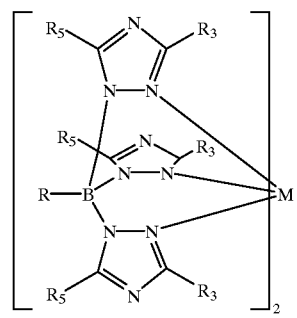

VIII wherein M for compounds represented by formulas V and VI is a +3 metal ion, preferably aluminum, gallium or indium, while M for compounds represented by formulas VII and VIII is a +2 metal ion, preferably zinc; and $R_1$ through $R_5$ are each independently selected from the group consisting of hydrogen, alkyl and aryl.

BRIEF DESCRIPTION OF THE DRAWINGS

The following drawings pertaining to the present invention, in which like reference characters indicate like parts, are illustrative of embodiments of the invention, and are not intended to limit the scope of the invention as encompassed by the claims forming part of the application.

DETAILED DESCRIPTION OF THE INVENTION

Figure 1:
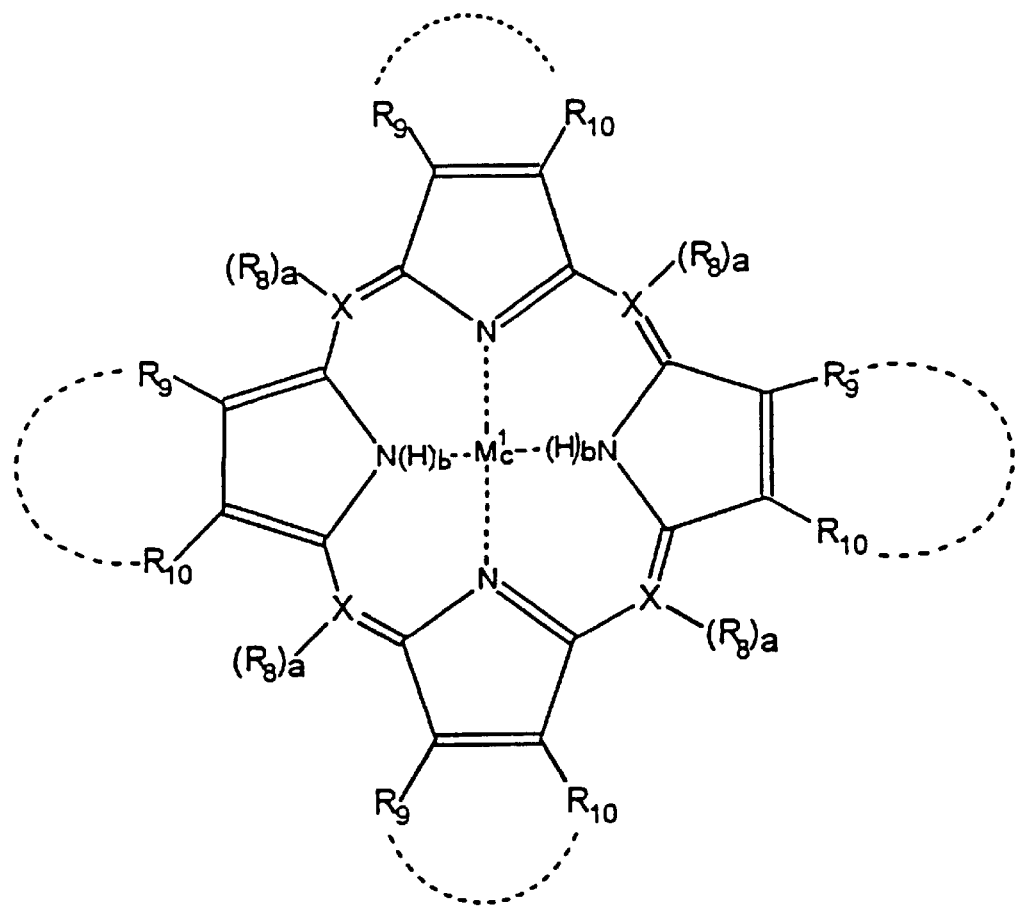
FIGS. 1 represents a structural formula of dopants for use in light emitting devices in accordance with the present invention.
Figure 2I:
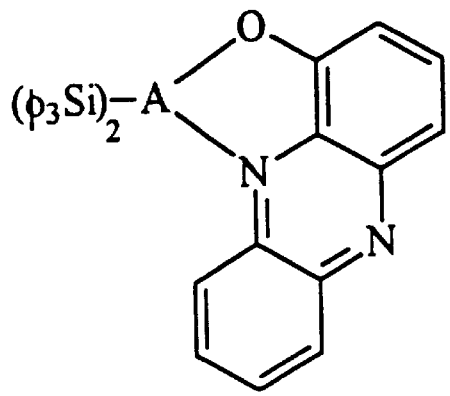
FIGS. 2A–10J are structural formulas of emitting compounds which can be used to receive dopants in accordance with the present invention.
Figure 2H:
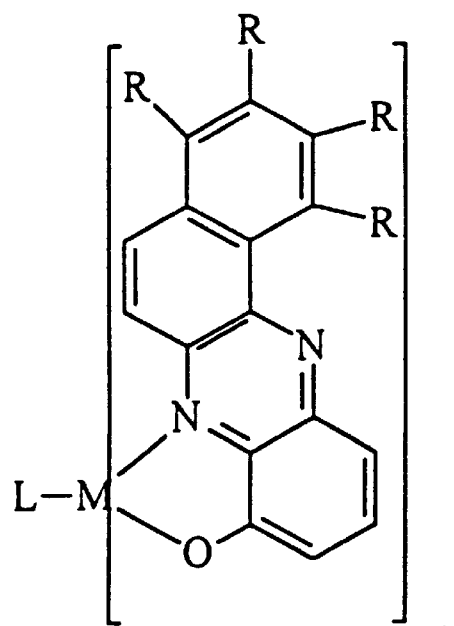
Figure 2C:
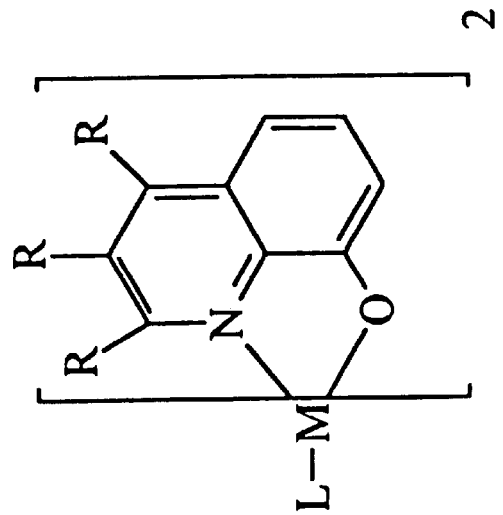
Figure 2B:
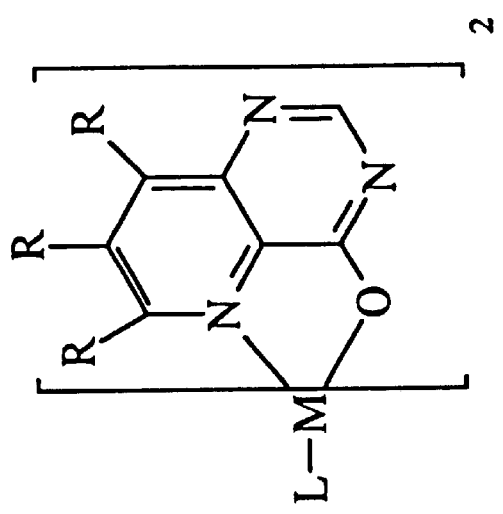
Figure 2A:
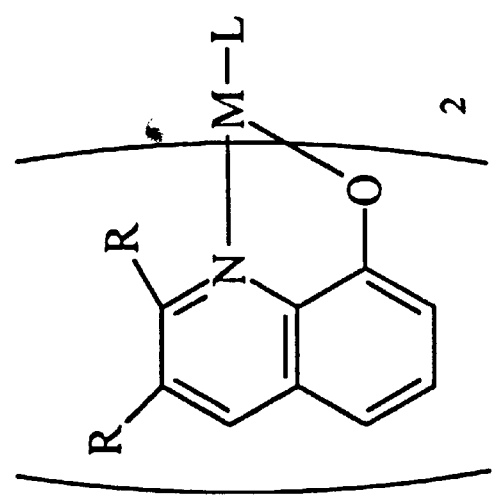
Figure 2D:
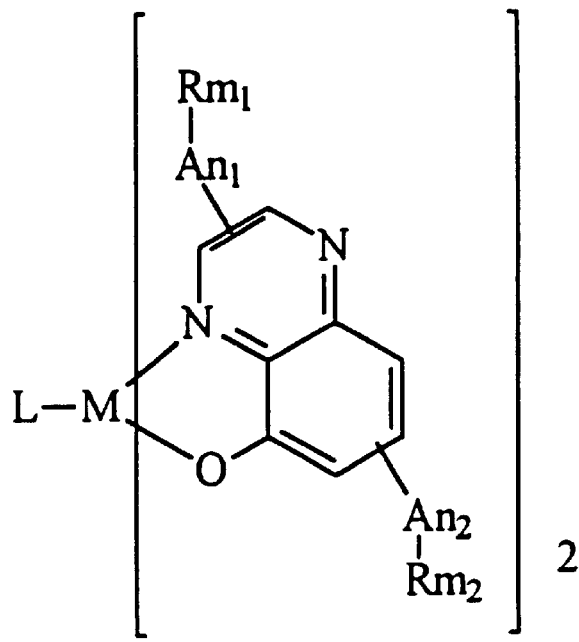
Figure 2E:
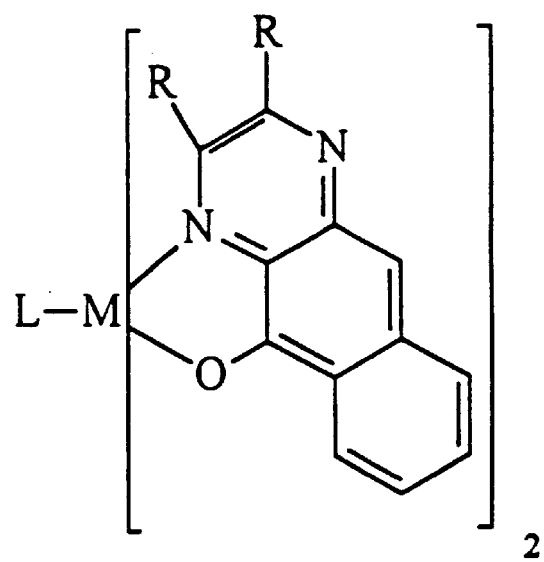
Figure 2F:
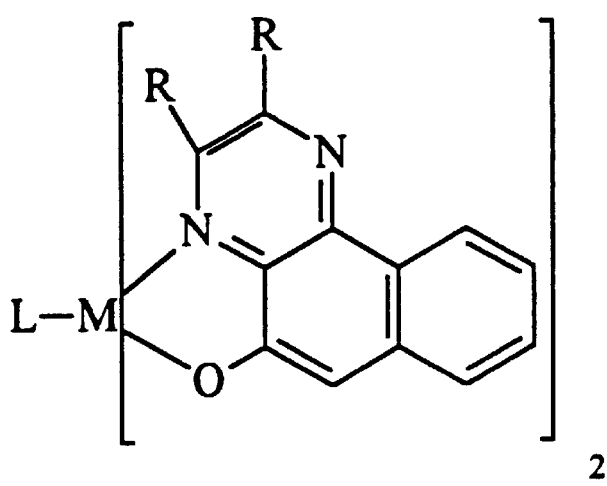
Figure 2G:
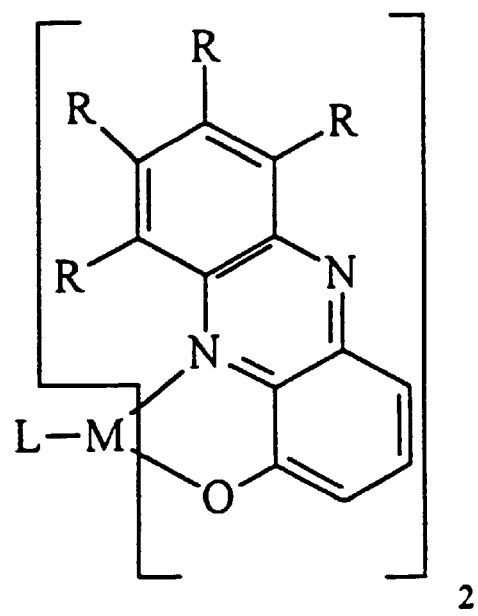
Figure 3A:
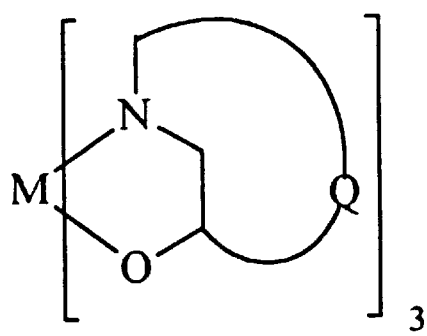
Figure 3B:
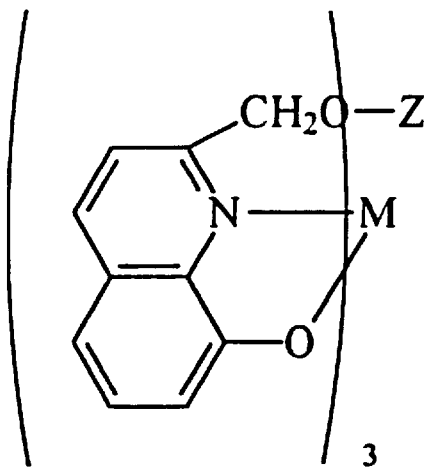
Figure 3C:
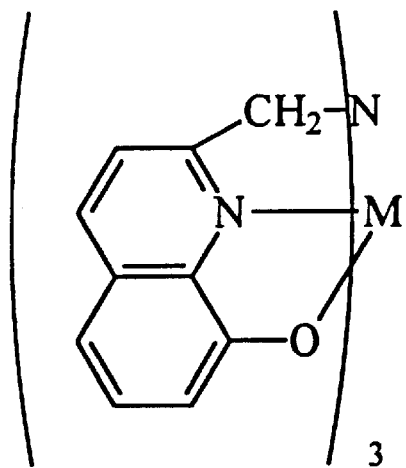
Figure 3D:
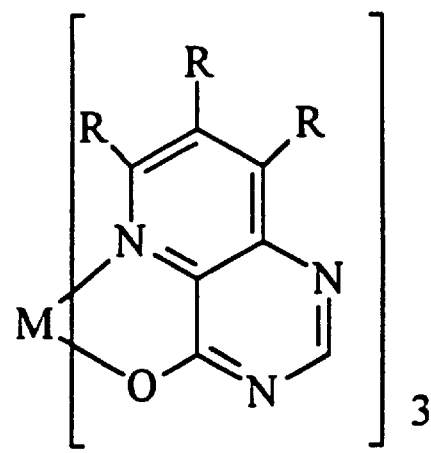
Figure 3M:
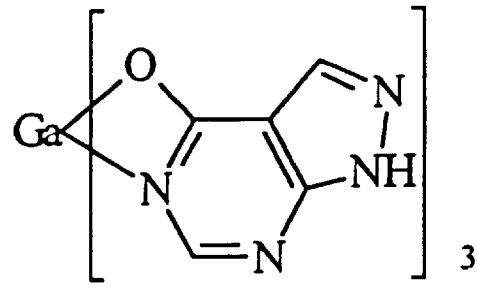
Figure 3E:
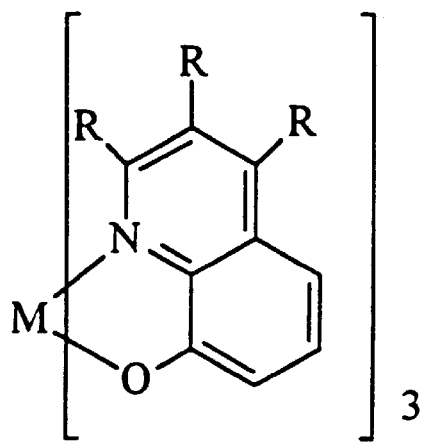
Figure 3F:
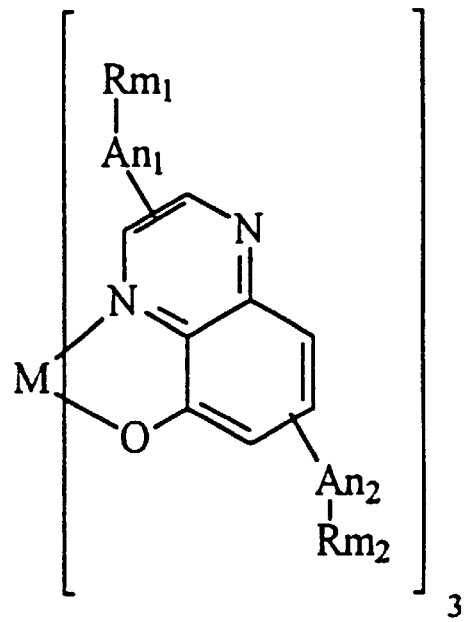
Figure 3G:
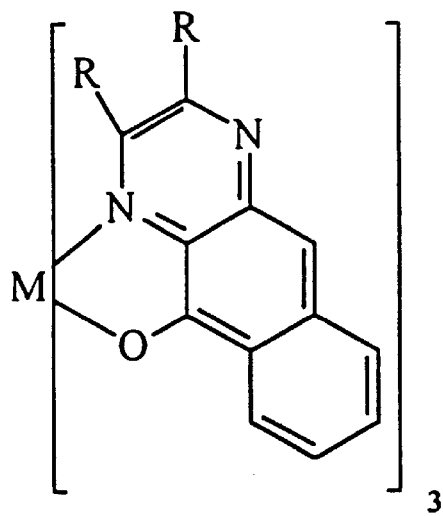
Figure 3H:
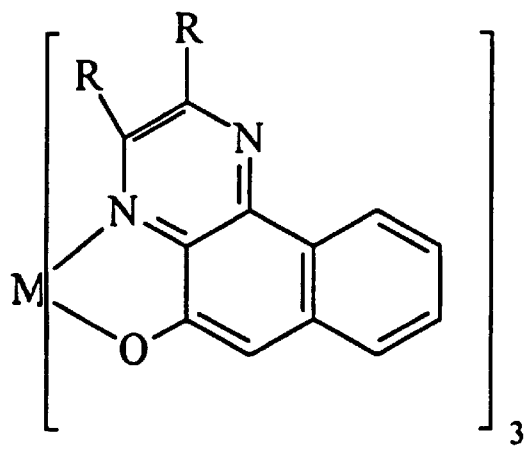
Figure 3K:
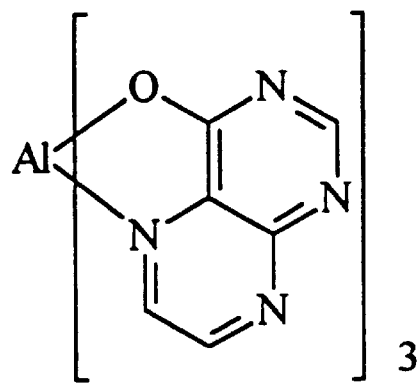
Figure 3L:
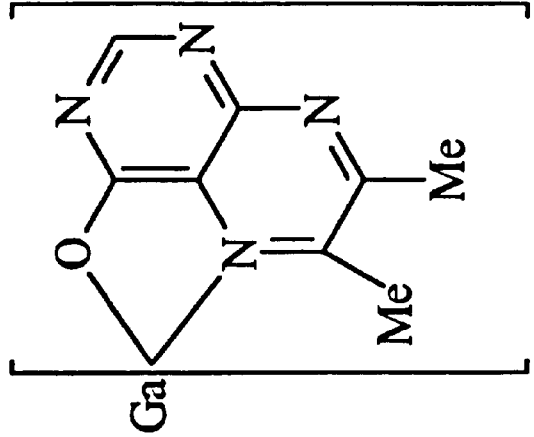
Figure 3J:
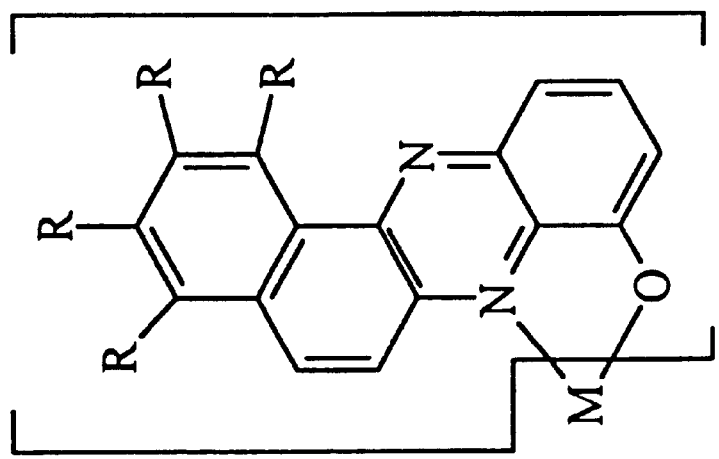
Figure 3I:
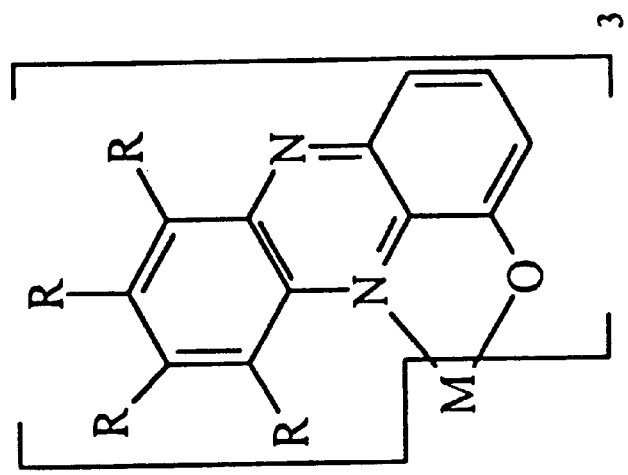
Figure 5:
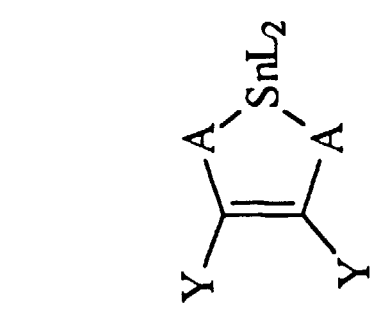
Figure 4B:
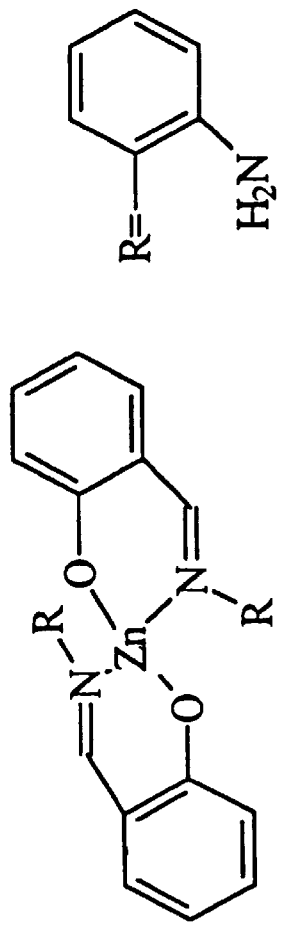
Figure 6:
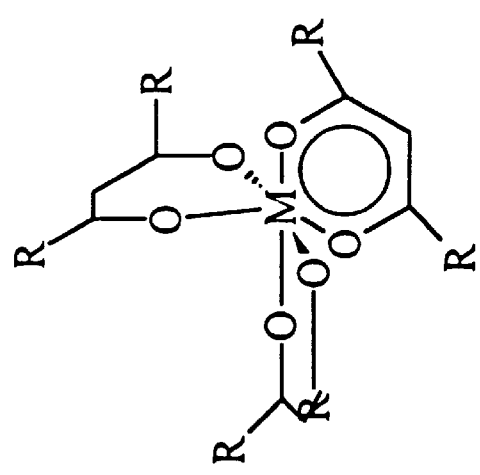
Figure 4A:
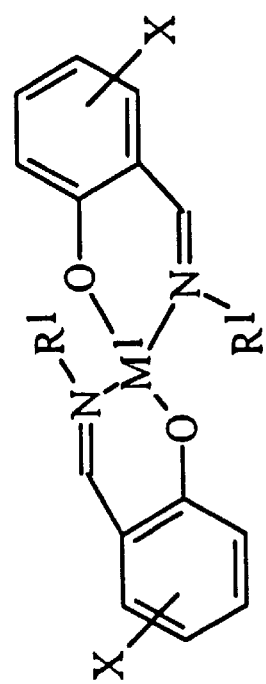
Figure 7A:
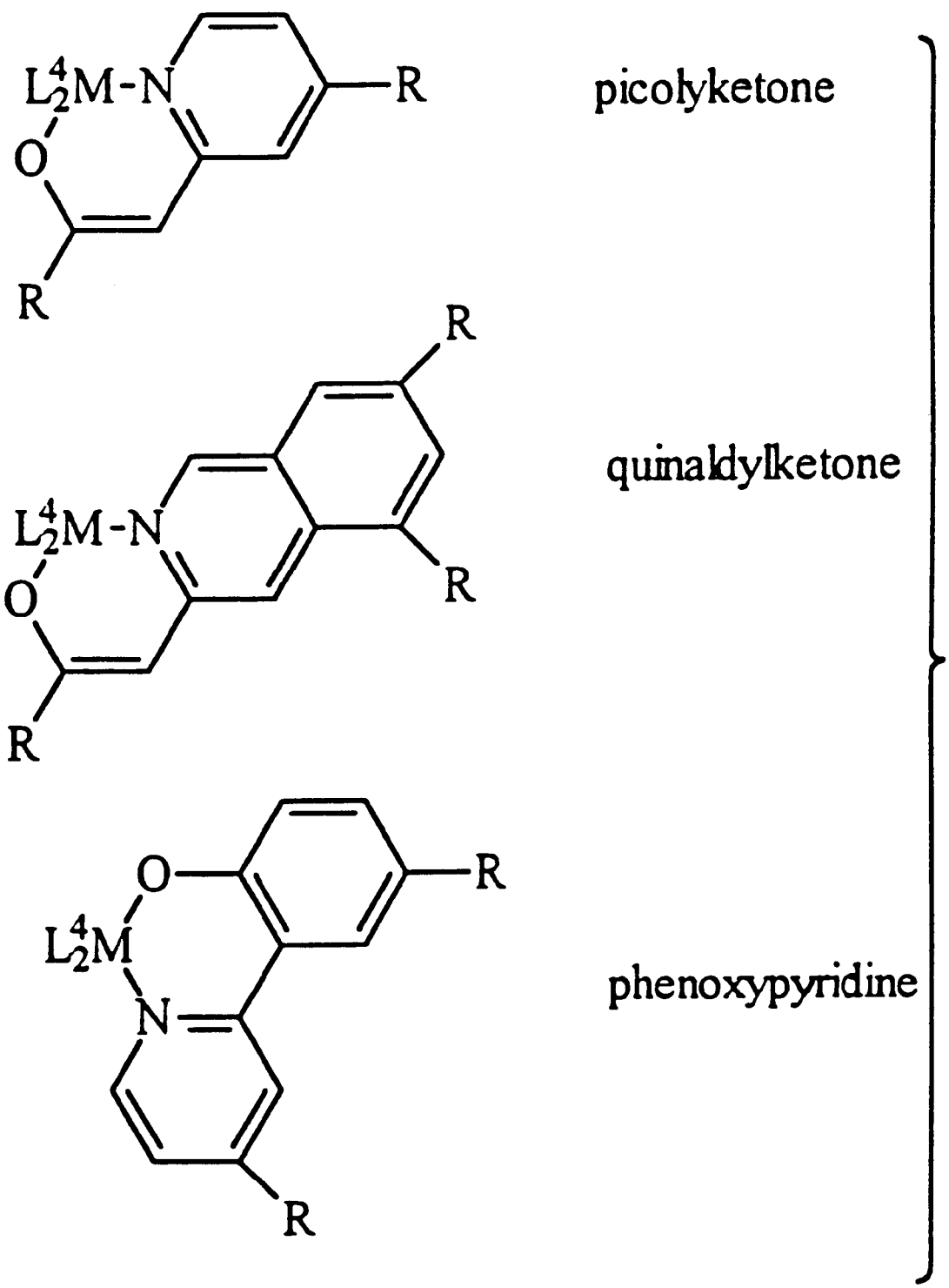
Figure 7B:
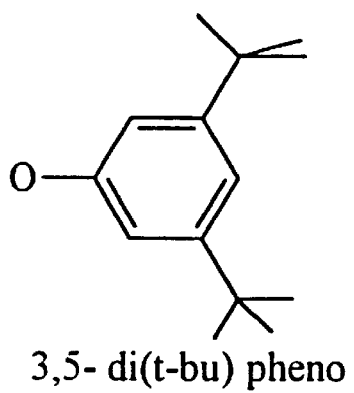
Figure 7C:
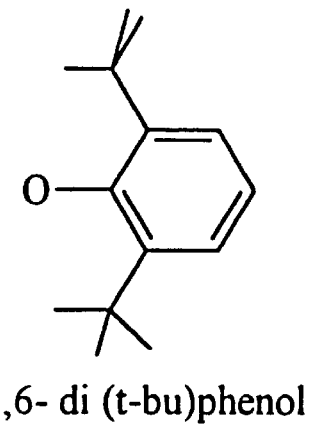
Figure 7D:
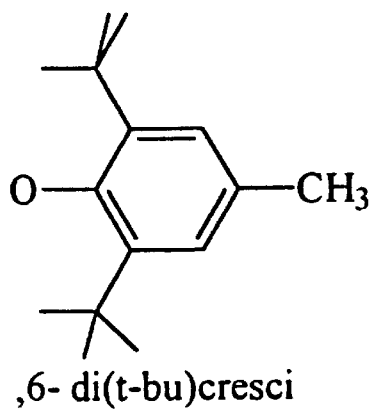
Figure 7E:
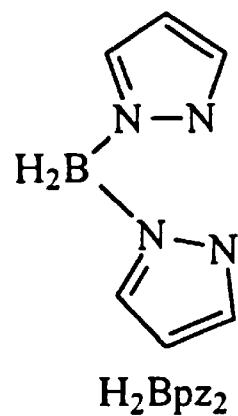
Figure 10E:
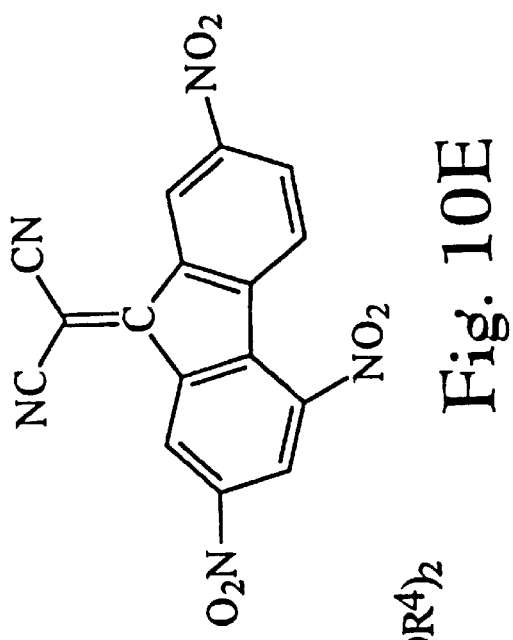
Figure 8A:
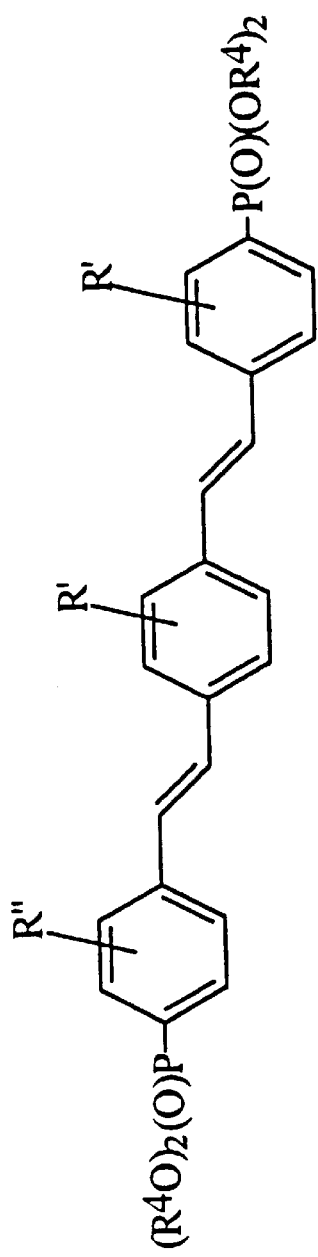
Figure 8B:
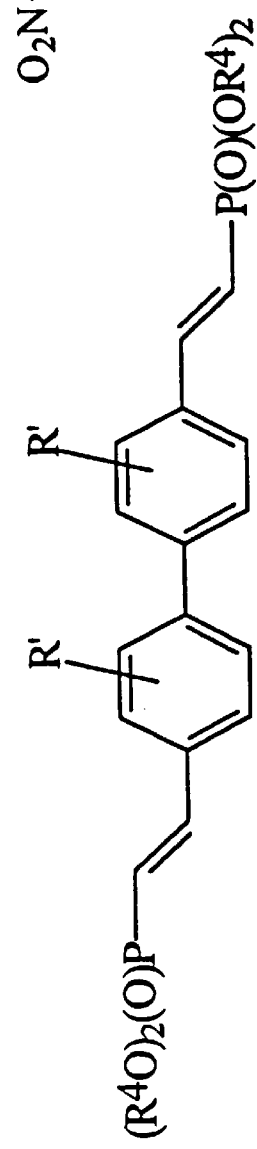
Figure 9:
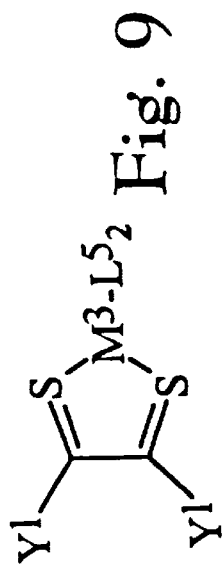
Figure 10G:
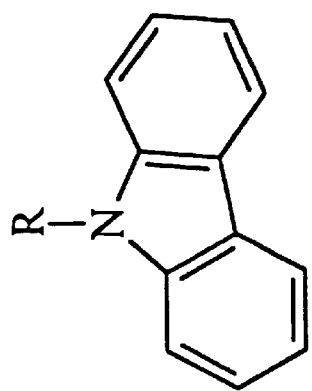
Figure 10H:
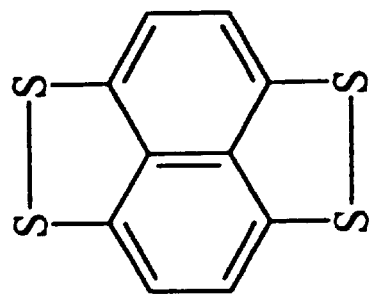
Figure 10I:
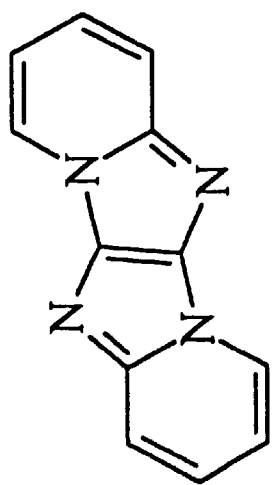
Figure 10J:
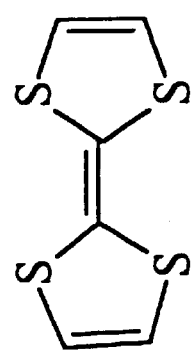
Figure 11B:
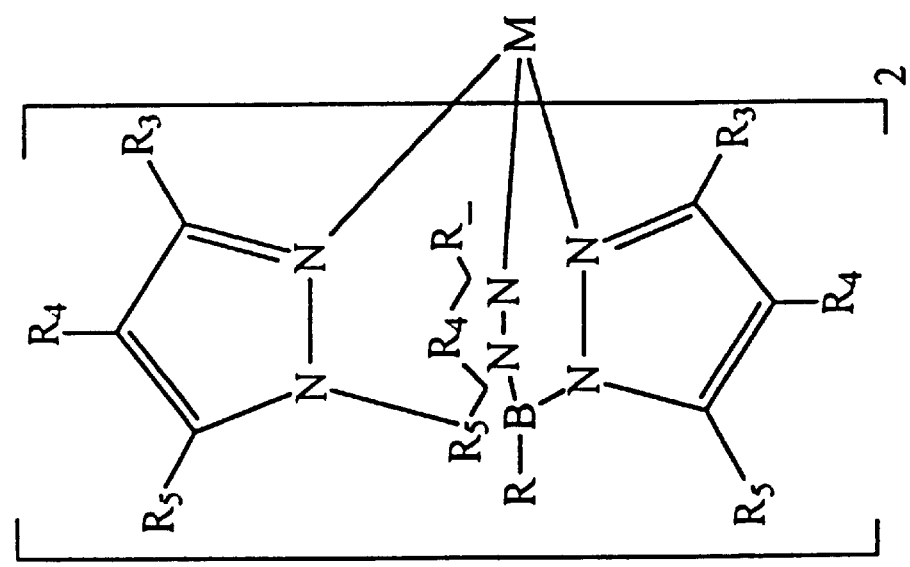
FIGS. 11A–11D are structural formulas of host compounds which can be used to receive dopants in accordance with the present invention.
Figure 11A:
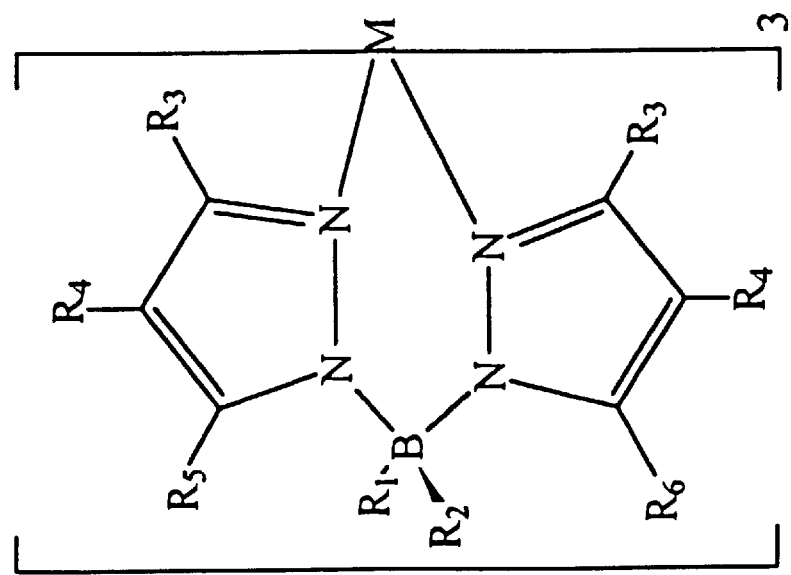
Figure 11D:
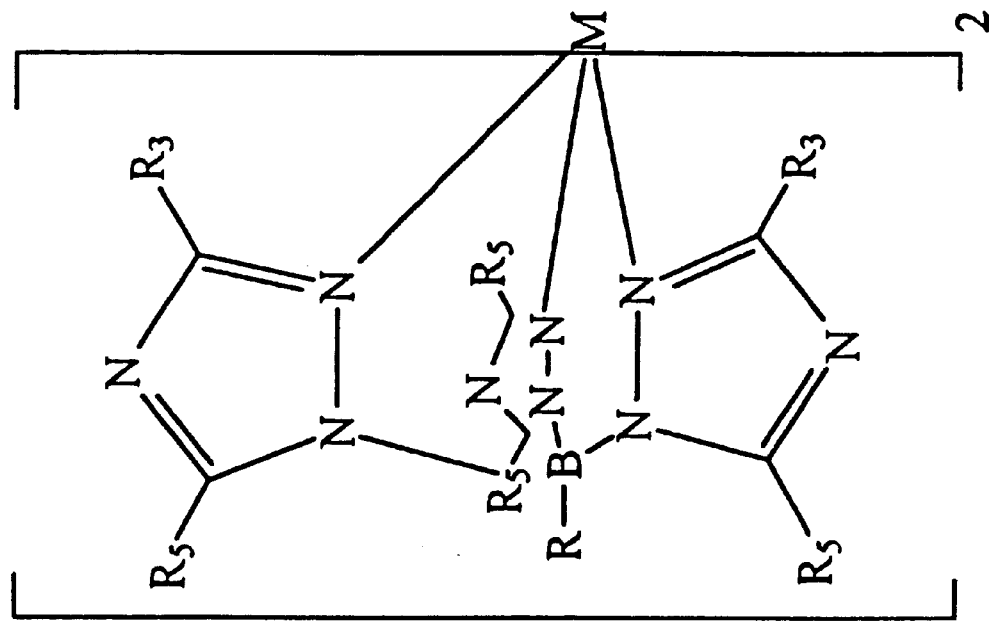
Figure 11C:
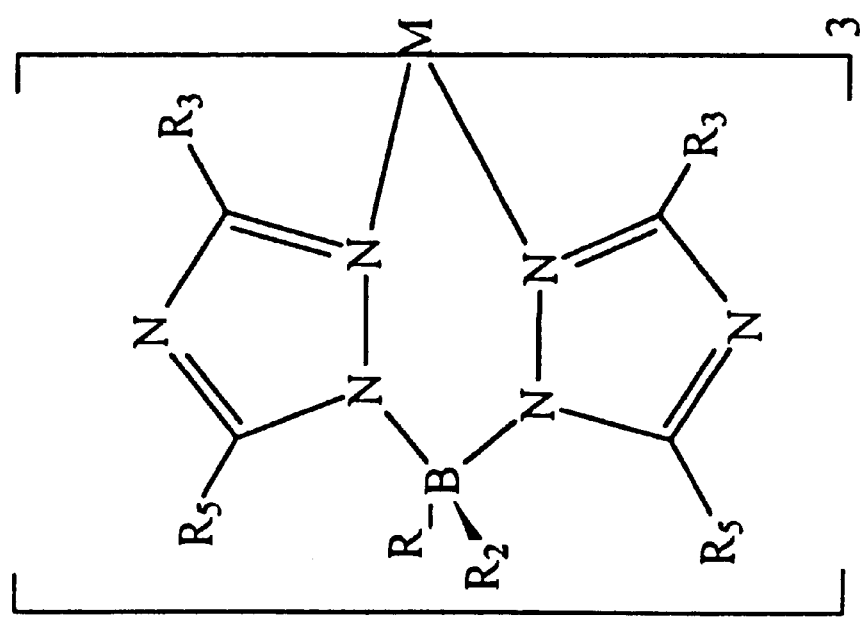

The present invention is generally directed to the addition of dopants to suitable receiving compounds as defined herein to generate an emission of light in the red region of the visible spectrum (i.e. about 650 nm) when such doped materials are used in functional layers of light emitting devices (LED's). The present invention is particularly adapted to organic light emitting devices (OLED's) which emit light that appears to the typical observer as being close to saturated red.

The emission of red light in light emitting devices has been accomplished previously with emitting compounds that emit light in the region of 640 nm to 740 nm. Clarity of the emission, however, has been problematical because the light is emitted at wavelengths which deviate significantly from those associated with saturated red (i.e., <650 nm). For example, emissions at about 675 nm are in the deep red region, while emissions somewhat below 650 nm generally result in a faded red emission. It is therefore desirable to formulate an OLED which is capable of emitting saturated red light with wavelengths in a region closely defined around 650 nm. For comparison purposes, the CIE color coordinates for a red video signal, according to the International Telecommunications Union (ITU) would be x=0.6430; y=0.330; and z=0.030.

In accordance with the present invention, a dopant, capable of shifting the emission wavelength of a receiving compound, is added to a receiving compound in an amount effective to shift the wavelength of emission so that the LED device emits light that is perceived by the human eye to be close to a saturated red color. Although it would be recognized that the characterization of color perceptions is an extremely subjective exercise, a quantitative chromicity scale has been developed by the Commission Internationale de l'Eclairage (International Commission of Illumination), otherwise known as the CIE standard. According to this standard, a saturated red color would be represented by a single point, with specific quantitative coordinates according to the defined axes of the chromaticity scale. It will be appreciated by one of skill in the art that such a single point on the CIE scale would represent a standard or a goal that, in practical terms, is difficult, but fortunately, unnecessary, to attain. However, through the practice of the present invention, it is possible to construct OLED's characterized by an emission that is closer to an absolute (or saturated) value, as that would be defined by the CIE scale, than heretofore possible. Examples of suitable receiving compounds including emitting compounds and/or host compounds are of the type shown and described in Applicants' co-pending U.S. patent application Ser. No. 08/693,359, filed Aug. 6, 1996.

As the term receiving compound is used herein, it will be appreciated that such compounds can be found in either an electron transporting/emissive layer (ETL/EL) of a single heterostructure LED device, or in the emissive layer of a double heterostructure device. As will be recognized by one of skill in the art, the use of dopant species such as disclosed herein makes it possible to both extend the range of colors emitted by the EL or ETL/EL of an OLED, but also to extend the range of possible candidate species for receiving compounds. Accordingly, for effective receiving/dopant systems, although the receiving compound can have a strong emission in a region of the spectrum where the dopant species strongly absorbs light, the receiving species cannot have an emission band in a region where the dopant also emits. In structures where the receiving compound also functions as a charge carrier (combined ETL/EL), then additional criteria such as redox potential for the species also becomes a consideration. In general, however, the spectral characteristics of the receiving and dopant species are the most important criteria.

Dopants for use in the present invention are represented by compounds of Formula I:

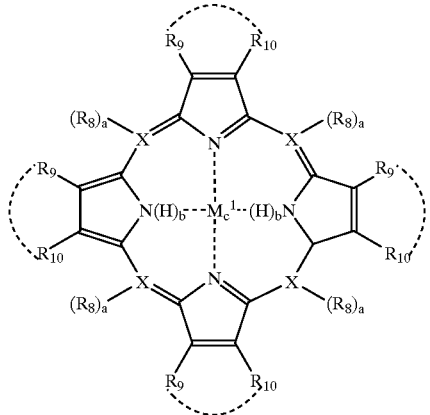

wherein

X is C or N;

$R_8$, $R_9$, and $R_{10}$ are each independently selected from the group consisting of hydrogen; alkyl; substituted alky; aryl; substituted aryl, with substituents selected from the group consisting of lower alkyls, halogens and recognized donor and acceptor groups;

$R_9$ and $R_{10}$ may be combined together to form a fused ring;

$M_1$ is a divalent, trivalent or tetravalent metal;

a, b and c are each 0 or 1;

wherein, when X is C, then a is 1; when X is N, then a is 0;

when c is 1, then b is 0; and when b is 1, c is 0.

The preferred metals for $M^1$ (when c=1) are metals from either the transition metal group or main groups of the Periodic Table.

Also contemplated are acetylenyl bis-molecular arrays of the compounds of Formula I, represented, in general, by the formula I—C≡C—I, as disclosed in Lin, V. S. -Y.; Therien, M. J., *Science* 264, 1105–1111 (1994).

Preferred compounds of Formula I include those where X is nitrogen (i.e. a is 1), R is phenyl, C is 0, and b is 1. An example of a preferred compound of Formula 1 is (5,10,15, 20 tetraphenyl-21H,23H-porphine). Compounds of Formula I can be made according to procedures detailed in the technical literature, as would be recognized by one of skill in the relevant art.

The amount of the dopants of the compounds of Formulas I and II for use in the present invention is an amount sufficient to shift the emission wavelength of the red emitting material as close as possible to saturated red as that would be defined according to the CIE scale. Typically, the effective amount is from about 0.01 to 10.0 mol %, based on the emitting layer. The preferred amount is from about 0.1 to 1.0 mol %. However, it will be recognized here that the sole criterion for determining an appropriate doping level is the level effective to achieve an emission with the appropriate spectral characteristics. By way of example, and without limitation, if the amount of dopant species is at too low a level, then emission from the device will also comprise a component of light from the host compound itself, which will be at shorter wavelengths than the desired emission form the dopant species. In contrast, if the level of dopant is too high, emission efficiencies could be adversely affected by self-quenching, a net non-emissive mechanism. Alternatively, too high levels of the dopant species could also adversely affect the hole or electron transporting properties of the host material.

The receiving compounds for receiving the dopant species of the present invention include compounds capable for forming a continuous film and which have an energy gap greater than that of the dopant. Typical examples of such compounds include emitting compounds of the type covered by Formulas II–IV:

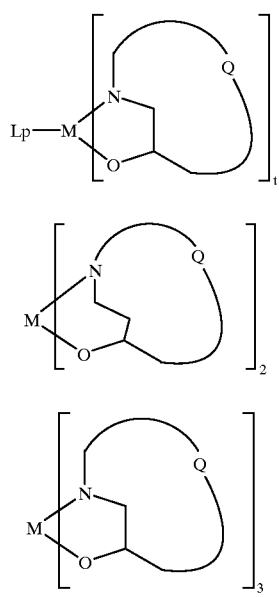

wherein
M is a trivalent metal ion for II and IV, and a divalent metal ion for III;
Q is at least one fused ring, at least one of said fused rings containing at least one nitrogen atom;
and L is a ligand selected from the group consisting of: picolylmethylketone; substituted and unsubstituted salicylaldehyde;

a group of the formula $R^1(O)CO$,
wherein $R^1$ is selected from the group consisting of hydrogen, an alkyl group, an aryl group, and a heterocyclic group, each of which may be substituted with at least one substituent selected from the group consisting of aryl, halogen, cyano and alkoxy;

halogen;

a group of the formula $R^1O$, wherein $R^1$ is as defined above;

bistriphenyl siloxides; and quinolates and derivatives thereof;

p is 1 or 2; and t is 1 or 2, where p does not equal t.

The preferred trivalent metals are aluminum, gallium, and indium; the preferred divalent metal is zinc.

The receiver compound also includes host compounds of the type covered by Formulas V–VIII:

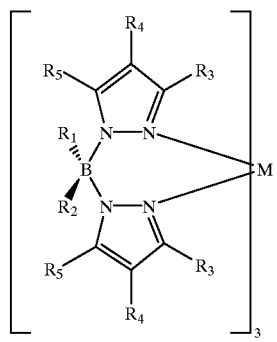

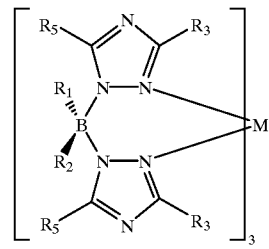

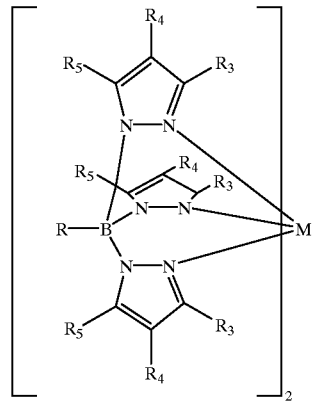

VIII

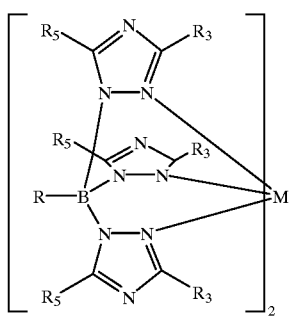

Preferred emitting compounds are those covered by Formulas IX and X:

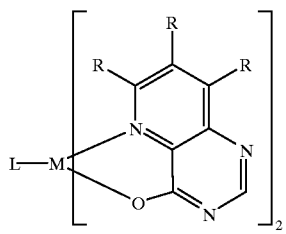

IX

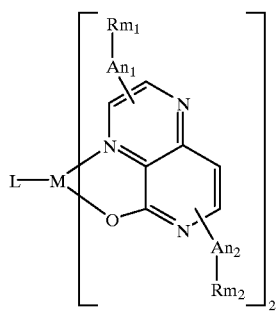

X wherein

R is selected from the group consisting of hydrogen, an alkyl group, an aryl group, and a heterocyclic group, each of which may be substituted with at least one substituent selected from the group consisting of: aryl, halogen, cyano and alkoxy;

M is a trivalent metal ion;

L is a ligand selected from the group consisting of:
  picolylmethylketone, substituted and unsubstituted salicylaldehyde, a group of the formula $R^1(O)CO$, wherein $R^1$ is selected from the group consisting of: hydrogen, an alkyl group, and a heterocyclic group, each of which may be substituted with at least one substituent selected from the group consisting of: aryl, halogen, cyano and alkoxy;
  halogen;
  a group of the formula $R^1O$, wherein $R^1$ is as defined above;
  BIS(triphenyl) siloxides;
  and quinolates and derivatives thereof;

A is an aryl group or a nitrogen-containing heterocyclic group fused to the existing fused ring structure;

$n_1$ and $n_2$ are independently 0, 1, or 2; and $m_1$ and $m_2$ are independently 1, 2, 3, and 4.

Also preferred as emitters are compounds of Formulas XI and XII:

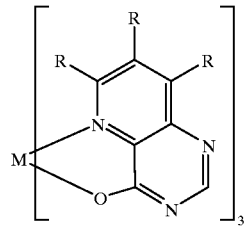

XI

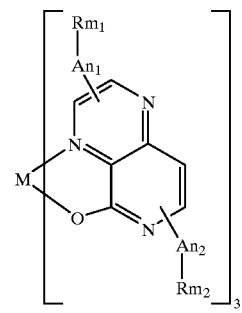

XII wherein R, M, A, n1, n2, m1, and m2 are as defined above.

Figure 12:
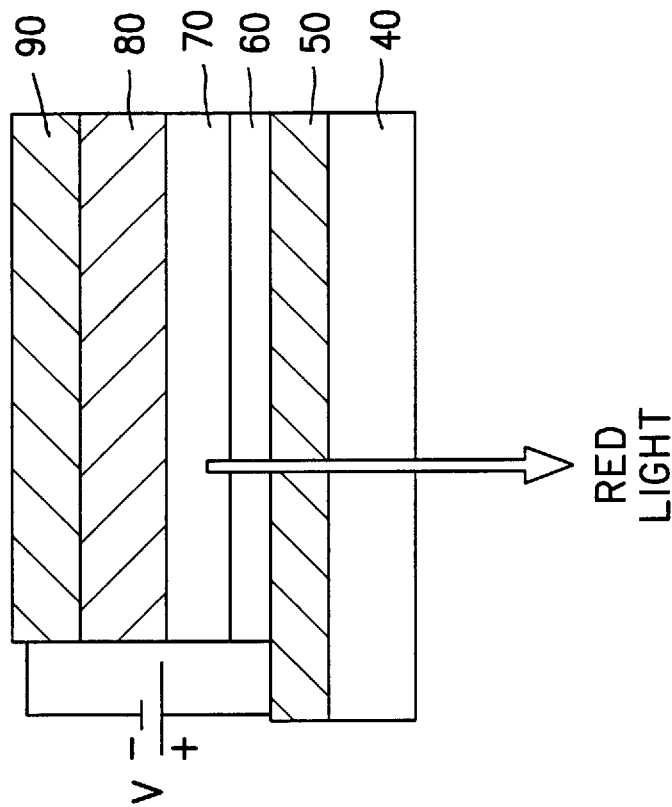
FIG. 12 is a cross-sectional view of an OLED device that can be employed in accordance with the present invention.

FIG. 12 shows a prior art OLED structure that can be utilized with the dopants and the receiver compounds of the present invention to emit saturated red light. A device such as that shown in FIG. 12, when used in the practice of the present invention, would have a 1-mm glass layer 40 coated with 2000 Å of indium-doped tin oxide (ITO) 50 as a device substrate. Deposited on the ITO layer is a 300 Å-thick hole transporting layer (HTL) 60 comprised of a receiver compound such as TPD (N,N'-diphenyl-N,N'-bis(3-methylphenyl)-1,1'-biphenyl-4,4'-diamine). There is then deposited a 500 Å-thick layer of a receiver compound doped with a compound of the present invention 70, such as 5,10,15,20-tetraphenyl-21H,23H-porphine (TPP) at a level of 3 mol %. This structure is then covered by a two-layer electrode, with a Mg:Ag alloy as the first layer 80, covered by Ag 90.

Other device structures which can be used in accordance with the present invention include, but are not limited to, those shown in FIGS. 13A–13C and FIG. 14, each of which are described in detail in Applicants' co-pending application Ser. No. 08/693,359, filed Aug. 6, 1996, incorporated herein by reference. In addition, the subject invention as disclosed herein may be used in conjunction with the subject matter of co-pending applications, "High Reliability, High Efficiency, Integratable Organic Light Emitting Devices and Methods of Producing Same," U.S. Ser. No. 08/774,119 "Novel Materials for Multicolor LED's," U.S. Ser. No. 08/771,815 "Electron Transporting And Light Emitting Layers Based On Organic Free Radicals," U.S. Ser. No. 08/774,120 "Multicolor Display Devices," U.S. Ser. No. 08/772,333 and "High Efficiency Organic Light Emitting Device Structures," U.S. Ser. No. 08/772,332 each of said co-pending application being filed on the same date as the instant application, and being herein incorporated in their entirety by reference. The subject invention may also be used in conjunction with the subject matter of co-pending U.S. Ser. Nos. 08/354,674 which issued as U.S. Pat. No. 5,707,745; 08/613,207 which issued as U.S. Pat. No. 5,703,436; 08/632,316; 08/632,322; 08/693,359; 60/010,013; and 60/024,001; which are also herein incorporated in their entirety by reference.

EXAMPLES

Example 1

Construction of a Red-Emitting OLED

Referring to FIG. 12, there is shown an OLED device particularly adapted for emitting saturated red light. The red OLED is grown on a glass substrate pre-coated with a transparent indium tin oxide (ITO) thin film with a nominal sheet resistivity of about 20Ω/square. Prior to deposition of the organic films, the substrates are pre-cleaned by ultrasonication in a mixture of isopropyl alcohol and water (1:1) and degassed in toluene vapor. The red OLED device is formed by sequential evaporation of a 600 Å-thick layer of a receiver material such as Alq₃ (tris(8-hydroxyquinolato) aluminum), and a 600 Å-thick layer consisting of approximately 3 mol % of 5,10,15,20 tetraphenyl-21H,23H-porphine (TPP). TPP represents a compound falling within Formula I, wherein c=0; b=1; $R_8$ is phenyl; X=C; and $R_9$=$R_{10}$=H. TPD represents a compound falling within Formula II, wherein $R_{11}$ is hydrogen, and $R_{12}$ is methyl.

Suitable receiving materials for use in devices such as those described immediately above would be exemplified by a compound of the formula given below:

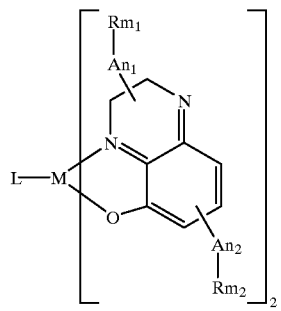

wherein M is aluminum and R is hydrogen, prepared by using co-evaporation techniques known to those of skill in the chemically deposited thin film arts. Light with a wavelength of about 650 nm is emitted from these devices when an external voltage, V, is applied through a power source such as a battery. The applied external voltage is typically in the range of from about 3 to about 25 V, depending on the brightness required.

Figure 15:
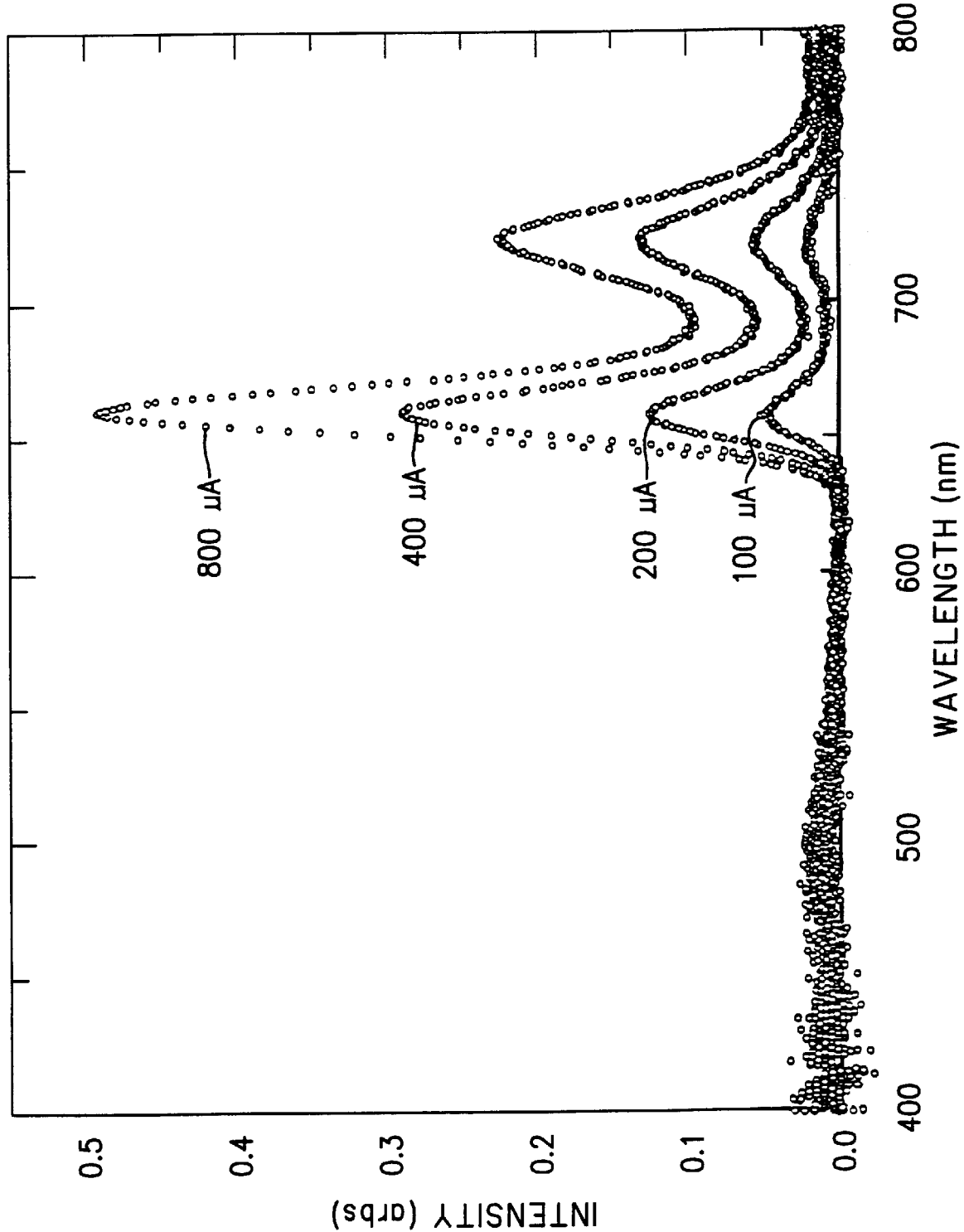
FIG. 15 is a plot of the emission spectrum of an embodiment of a red emitting layer of the present invention.

The output spectrum of a red-emitting OLED with a structure according to that of FIG. 12 is shown in FIG. 15. As that spectrum illustrates, output of light is essentially zero at wavelengths less than about 640 nm, with a strong emission band at about 650 nm.

Figure 16:
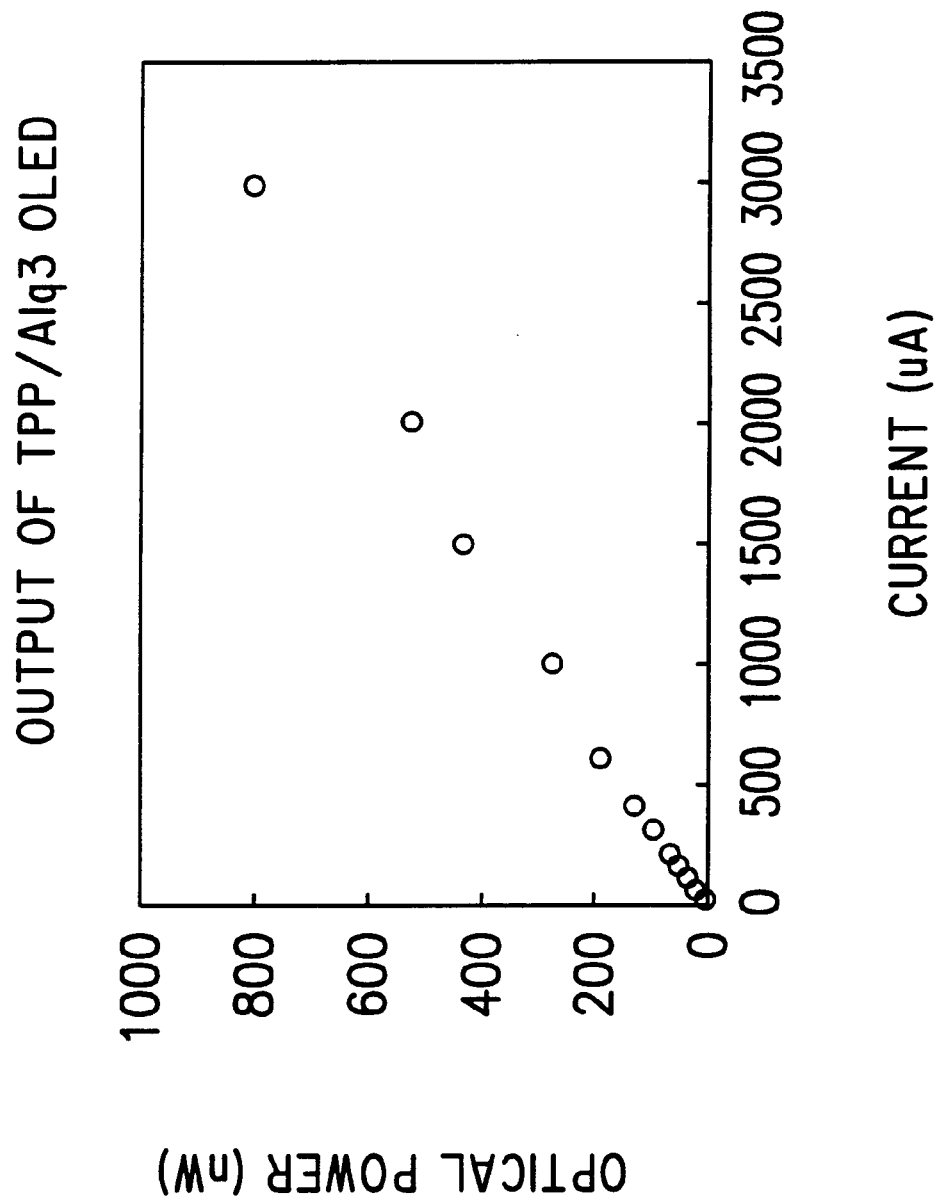
FIG. 16 is a plot showing the relationship between optical power and current obtained from an embodiment of the present invention.

FIG. 16 shows the optical power measured through the glass substrate as a function of drive current. As this Figure illustrates, there is an essentially linear relationship between the optical power output of the device of the Example as a function of current, demonstrating the efficiency of the red-emitting device utilizing the present invention. At 100 μA drive current, the measured quantum efficiency from a 1-mm circular device is approximately 0.14%, after allowing for lost light waveguided to the edge of the glass substrate.

Example 2

Construction of a Stacked Two-Element (Blue and Red) OLED

Figure 17:
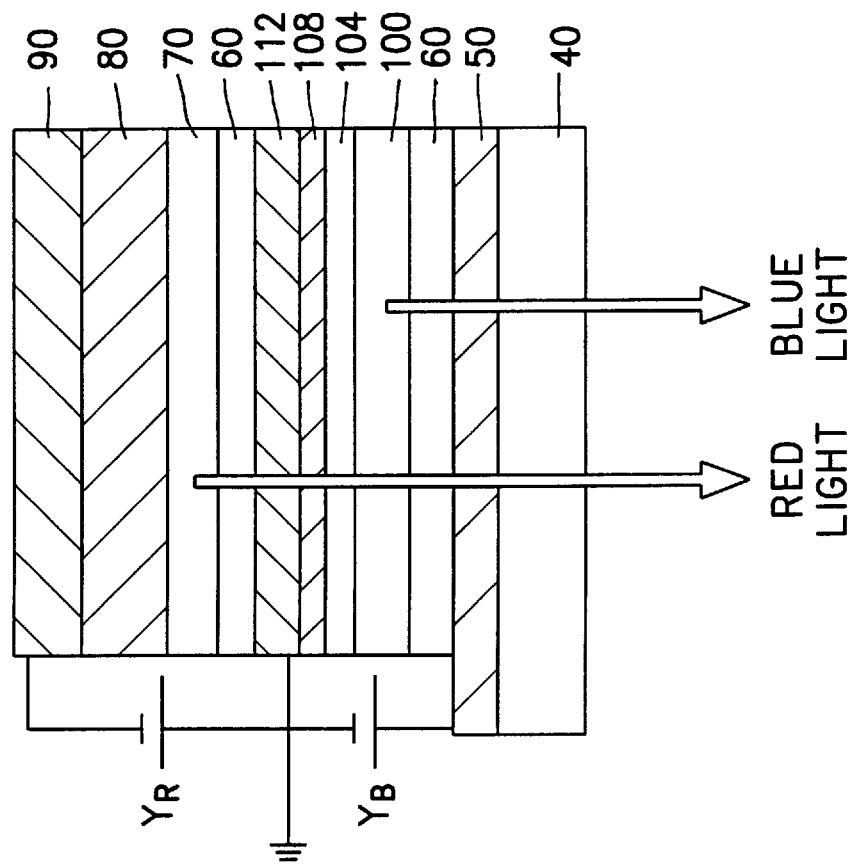
FIG. 17 is a cross-sectional view of an alternative embodiment of an OLED for use with the present invention for emitting both saturated red light and blue light.
Figure 13A:
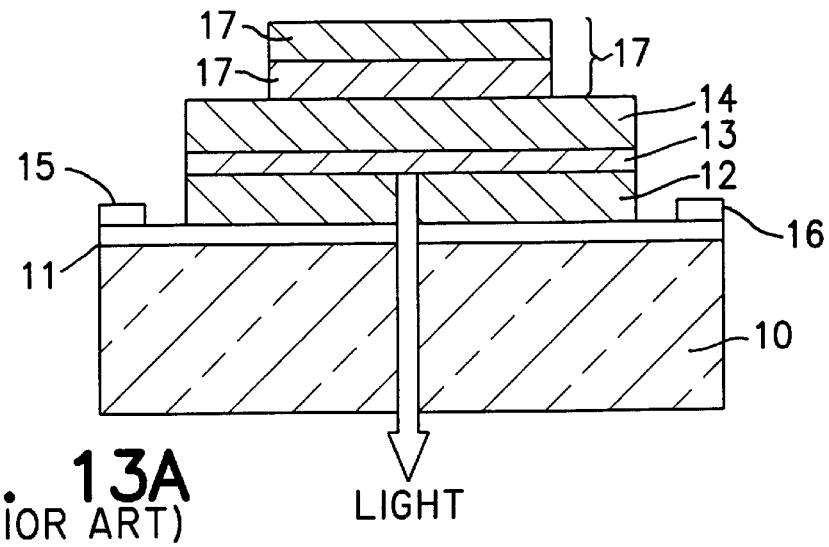
FIG. 13A is a cross-sectional view of a typical organic double heterostructure LED for use with the present invention.
Figure 13B:
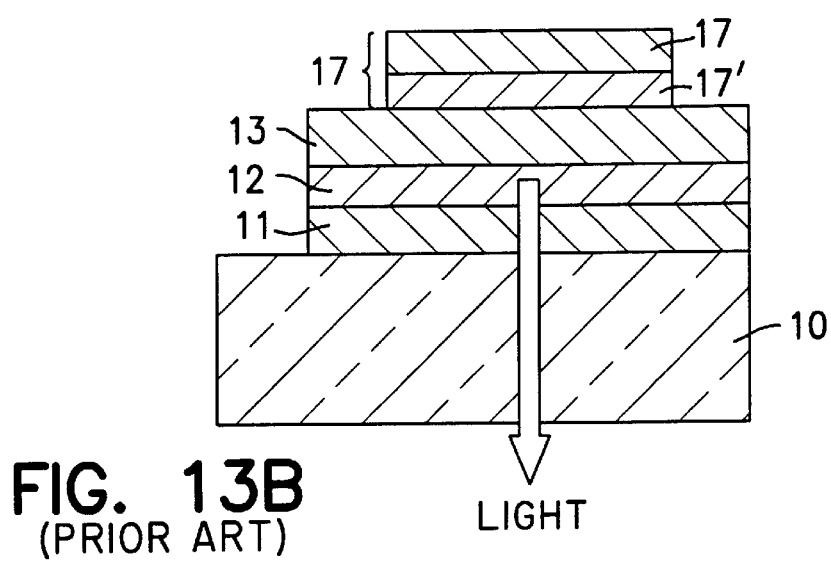
FIG. 13B is a cross-sectional view of a typical organic single heterostructure LED for use with the present invention.
Figure 13C:
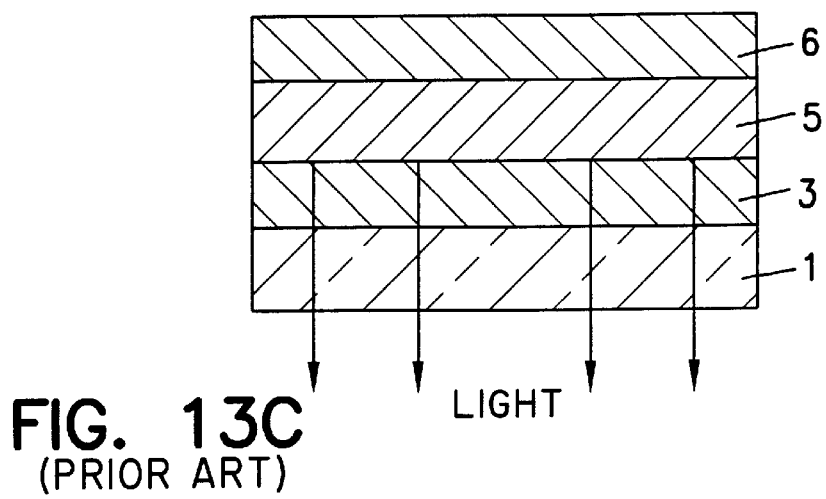
FIG. 13C is a cross-sectional view of a known single-layer polymer LED structure for use with the present invention.
Figure 14:
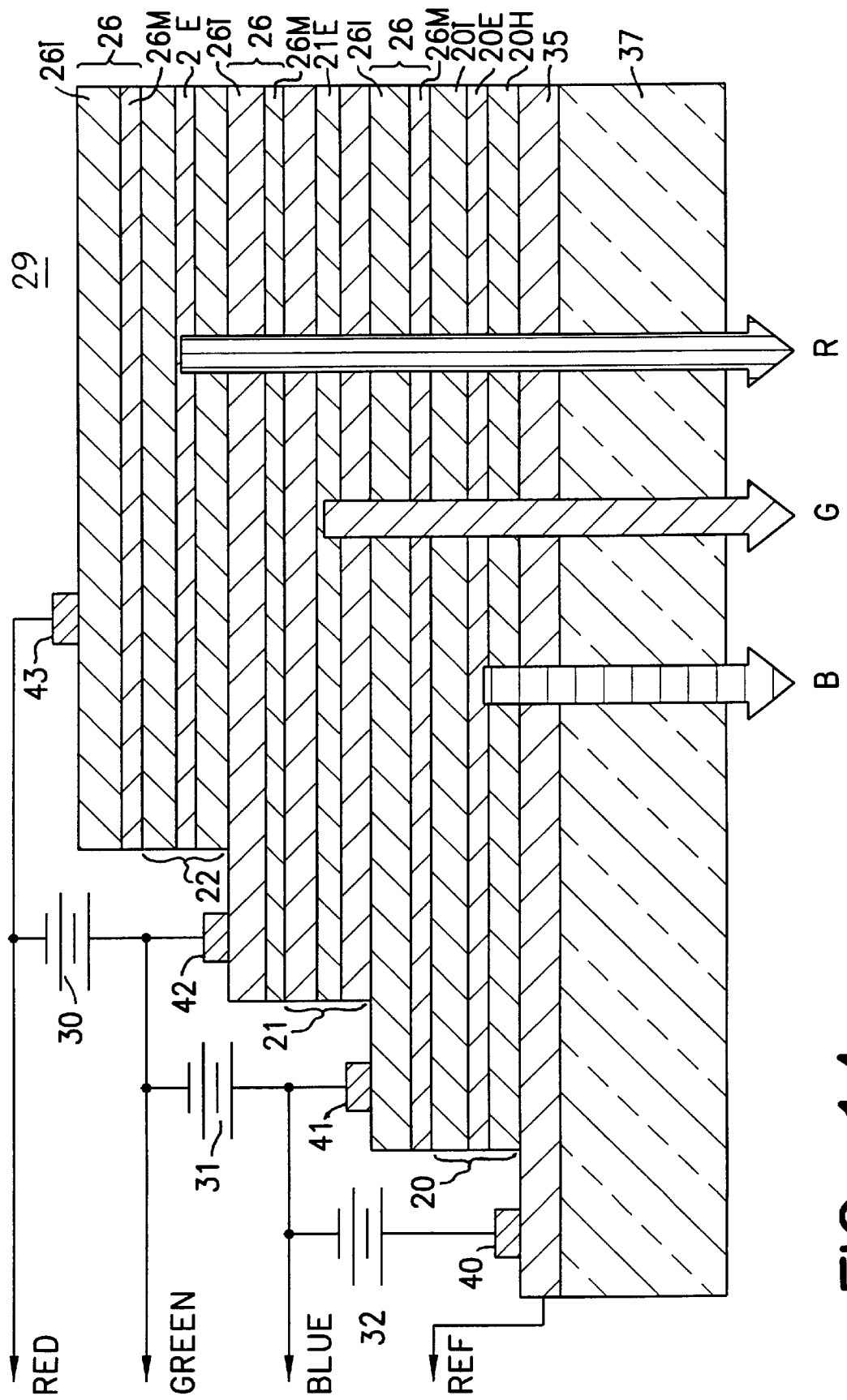
FIG. 14 is a cross-sectional view of an integrated three-color pixel utilizing crystalline organic light emitting devices (LED's) for use with the present invention.

FIG. 17 shows a multi-layer device including a red OLED with a TPP containing emitter layer stacked upon a blue OLED.

The device consists of a red OLED grown on top of a blue TOLED. The SOLED is grown on a glass substrate pre-coated with a transparent indium tin oxide (ITO) thin film with a nominal sheet resistivity of 20Ω/square. Prior to deposition of the organic films, the substrates are pre-cleaned as described above. A blue TOLED is grown by sequential evaporation, in a vacuum of <10⁻⁶ Torr, of three, pre-purified organic materials: a 600 Å-thick layer of hole conducting N,N'-diphenyl-N, N'-bis(3-methylphenyl)-1, 1'-biphenyl-4,4'-diamine (TPD), followed by an 800 Å-thick layer of blue fluorescent bis-(8-hydroxy)quinaldine aluminum phenoxide (Alq₂OPh), and a 360 Å-thick layer of electron-conducting tris (8-hydroxyquinolate aluminum) (Alq₃). The top, electron-injecting electrode consists of a 130 Å-thick Mg:Ag alloy (in an approximate atomic ratio of 50:1), deposited by thermal evaporation. This is immediately capped by a second, 500 Å-thick ITO layer sputter-deposited onto the Mg:Ag surface. The ITO layer provides an electrically continuous, transparent conducting surface on top of the thin metal film, protects the Mg—Ag electrode from oxidation, and serves as a hole injecting contact for a second OLED. The transparency of this Mg:Ag-ITO electrode in the visible spectral region for this particular device is approximately 50%. The second device is formed by sequential evaporation of a 600 Å-thick layer of TPD and a 600 Å-thick layer consisting of 1 mol % (3 mass %) of 5,10,15,20-tetraphenyl-21H,-23H-porphine (TPP) doped into tris(8-hydroxyquinilato) aluminum (Alq₃) using co-evaporation. Through a second shadow mask, a 1500 Å-thick layer of Mg:Ag is grown, and capped with a 500 Å-thick layer of Ag to inhibit top electrode oxidation.

All layers of the resulting stacked device are transparent with the exception of the top electrode, allowing for the extension of the device geometry to three or more colors. Alq₃ and TPD are highly transparent at wavelengths longer than 420 nm and, although TPP has several π-π* absorption peaks (Q-bands) in the green spectral region, the small concentration of TPP in Alq₃ (3 mass %) renders any absorption in the TPP/Alq₃ layer negligible. The absorption spectrum of the Mg:Ag-ITO electrode shows no strong absorption features in the visible spectral region, and a demonstrated transparency of up to 81%. There is also no evidence of photoluminescence pumping of the red element by the blue element, again due to the negligible absorption of the organic layers in the visible spectral region.

Figure 18:
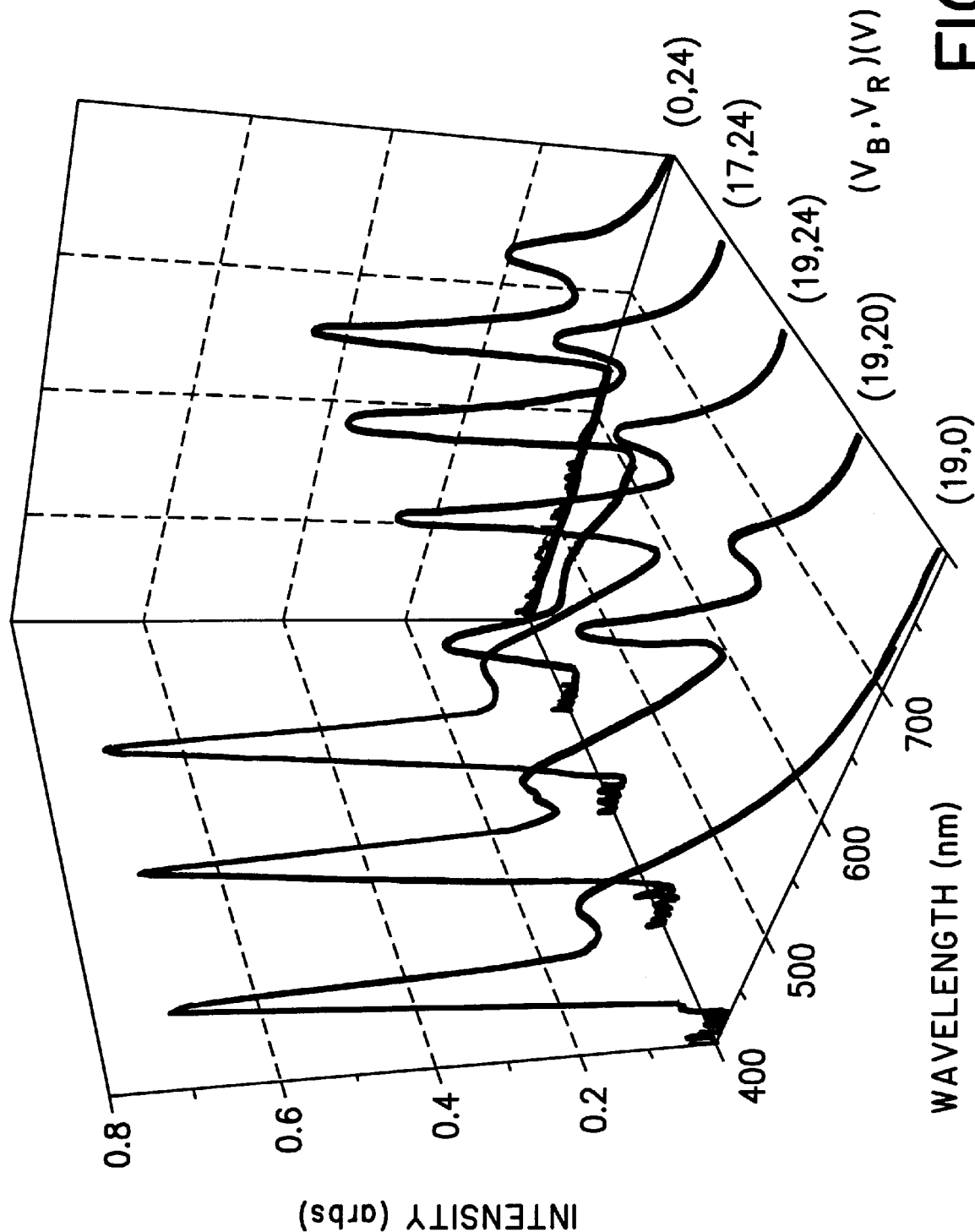
FIG. 18 is plot of the spectra at various voltages for a stacked, multiple-element OLED according to the present invention.

The device is operated by connecting the central Mg:Ag-ITO electrode to a common ground. The top Mg:Ag electrode and bottom ITO electrode are then biased negative and positive ($V_R$ and $V_B$), respectively. Output spectra from the device at various drive voltages are shown in FIG. 18. The spectra are measured by focusing light from the substrate surface of the device onto the entrance slit of a 0.275 m focal length spectrograph with an EG&G Optical Multichannel Analyzer at the output port. The device emission spectrum can be varied to be any linear superposition of the red (peak wavelength at 655 nm) and blue (peak wavelength at 470 nm) emission by independently varying the ratio of the drive voltage ($V_R/V_R$) of each element. Typical operating conditions for devices of about 1.5 mm in diameter are 0.1–1 mA, and from about 15 to 25 V drive voltage, to obtain an optical power output of from about 5–10 μW. FIG. 18 clearly shows that the light emission from each element in the device may be varied independently of the other, allowing for continuous color tuning between the extremes of color offered by the individual elements.

To estimate the quantum efficiency of the elements, a large-area silicon detector was used to measure the optical power through the glass substrate as a function of drive current. The quantum efficiencies of light emission were calculated to be 0.07% for the red and 0.49% for the blue elements, assuming that 50% of the light from the red pixel element is absorbed in the central electrode. The corresponding brightness is 42 cd/m$^2$ for the red element, and greater than 200 cd/m$^2$ for the blue elements, sufficient for video display device applications.

Using the basic teachings disclosed above, other OLED-based devices can be fabricated using the present invention in structures such as shown in FIG. 15.

What is claimed is:

1. A light emitting device (LED) capable of producing red emission, the LED comprising:

a light emitting device containing an emission layer comprising at least one receiving compound and an emitting compound having a structure represented by Formula I:

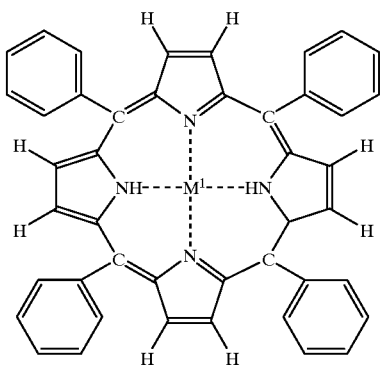

I wherein M$^1$ is a divalent, trivalent or tetravalent metal.

2. A multicolor light emitting device (LED) structure comprising a plurality of at least a first and a second organic light emitting device (LED) stacked one upon the other to form a layered structure, with each LED separated one from the other by a transparent conductive layer to enable each device to receive a separate bias potential to cause an emission of light through the stack, at least one of the LED's comprising an emission layer comprised of an emitting compound having a structure represented by Formula I:

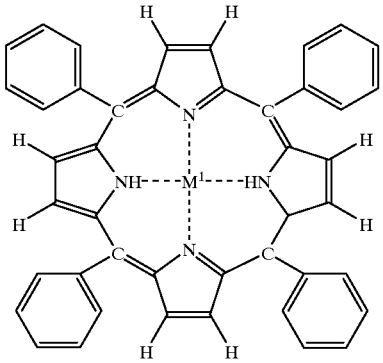

I wherein M$^1$ is a divalent, trivalent or tetravalent metal.

3. A display including a plurality of light emitting devices in accordance with claims 1 or 2.

4. A vehicle incorporating a display including the light emitting device of claims 1 or 2.

5. A television incorporating a display including the light emitting device of claims 1 or 2.

6. A computer incorporating a display including the light emitting device of claims 1 or 2.

7. A printer incorporating the light emitting device of claims 1 or 2.

8. A screen incorporating the light emitting device of claims 1 or 2.

9. A sign incorporating the light emitting device of claims 1 or 2.

10. A telecommunications device incorporating the light emitting device of claims 1 or 2.

11. A telephone incorporating the light emitting device of claims 1 or 2.

12. The light emitting device of claim 1 wherein the receiving compound is tris(8-hydroxyquinolate)aluminum.

13. The light emitting device of claim 2 wherein the receiving compound is tris(8-hydroxyquinolate)aluminum.

* * * * *